United States Patent
Chen et al.

(10) Patent No.: US 10,297,719 B2
(45) Date of Patent: May 21, 2019

(54) MICRO-LIGHT EMITTING DIODE (MICRO-LED) DEVICE

(71) Applicant: MIKRO MESA TECHNOLOGY CO., LTD., Apia (WS)

(72) Inventors: Li-Yi Chen, Tainan (TW); Shih-Chyn Lin, Tainan (TW); Hsin-Wei Lee, Tainan (TW); Pei-Yu Chang, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 14/836,976

(22) Filed: Aug. 27, 2015

(65) Prior Publication Data

US 2017/0062683 A1   Mar. 2, 2017

(51) Int. Cl.
*H01L 33/00* (2010.01)
*H01L 33/40* (2010.01)
*H01L 33/14* (2010.01)

(52) U.S. Cl.
CPC .......... *H01L 33/405* (2013.01); *H01L 33/145* (2013.01); *H01L 2224/18* (2013.01)

(58) Field of Classification Search
CPC ......... H01L 33/60; H01L 33/58; H01L 33/62; H01L 33/14; H01L 33/46; H01L 33/145; H01L 33/486; H01L 33/08; H01L 33/405; H01J 1/62
See application file for complete search history.

(56) References Cited

U.S. PATENT DOCUMENTS

| 8,333,860 | B1 | 12/2012 | Bibl et al. |
| 8,349,116 | B1 | 1/2013 | Bibl |
| 8,753,910 | B2 | 6/2014 | Cho et al. |
| 9,105,813 | B1* | 8/2015 | Chang ............... H01L 33/44 |
| 9,184,342 | B1* | 11/2015 | Chang ............... H01L 33/44 |
| 9,484,492 | B2 | 11/2016 | Bour |

(Continued)

FOREIGN PATENT DOCUMENTS

| CN | 101075651 A | 11/2007 |
| CN | 202797052 U | 3/2013 |
| CN | 104701433 A | 6/2015 |

OTHER PUBLICATIONS

WaferBOND HT-10. 10 Data Sheet, published at https://www.brewerscience.com/wp-content/uploads/2016/05/WafterBOND-HT-1010-Data-Sheet.pdf, Jan. 9, 2017.

*Primary Examiner* — Latanya N Crawford
(74) *Attorney, Agent, or Firm* — CKC & Partners Co., LLC

(57) ABSTRACT

A micro-light emitting diode (micro-LED) device includes a receiving substrate and a micro-LED. The micro-LED includes a first type semiconductor layer, a second type semiconductor layer, a current controlling layer, at least one reflective layer, and at least one first electrode. The second type semiconductor layer is joined with the first type semiconductor layer. The current controlling layer is joined with one of the first type semiconductor layer and the second type semiconductor layer, the current controlling layer having at least one opening therein. The reflective layer electrically is coupled with the first type semiconductor layer. The first electrode is disposed on a surface of the reflective layer facing the receiving substrate. The first electrode forms an adhesive bonding system with the receiving substrate.

17 Claims, 16 Drawing Sheets

(56) References Cited

U.S. PATENT DOCUMENTS

| | | | |
|---|---|---|---|
| 9,590,137 B2* | 3/2017 | Chen | H01L 33/145 |
| 2001/0050531 A1* | 12/2001 | Ikeda | B82Y 20/00 |
| | | | 313/498 |
| 2004/0245537 A1* | 12/2004 | Kawakami | H01S 5/32341 |
| | | | 257/95 |
| 2009/0034569 A1* | 2/2009 | Tanabe | H01S 5/22 |
| | | | 372/45.011 |
| 2009/0086781 A1* | 4/2009 | Tanabe | H01S 5/22 |
| | | | 372/46.01 |
| 2013/0020552 A1* | 1/2013 | Kazama | H01L 33/38 |
| | | | 257/13 |
| 2013/0026499 A1 | 1/2013 | Odnoblyudov | |
| 2013/0210194 A1* | 8/2013 | Bibl | H01L 24/83 |
| | | | 438/107 |
| 2013/0272330 A1* | 10/2013 | Joseph | H01S 5/02476 |
| | | | 372/36 |
| 2014/0084240 A1 | 3/2014 | Hu et al. | |
| 2014/0110738 A1* | 4/2014 | Yokobayashi | H01L 33/44 |
| | | | 257/98 |
| 2015/0263234 A1* | 9/2015 | Cho | H01L 33/007 |
| | | | 257/88 |
| 2015/0270442 A1* | 9/2015 | Chae | H01L 25/0753 |
| | | | 257/88 |

\* cited by examiner

MICRO-LIGHT EMITTING DIODE (MICRO-LED) DEVICE

BACKGROUND

Field of Invention

The present invention relates to a light-emitting diode device. More particularly, the present invention relates to a micro-light emitting diode device.

Description of Related Art

In the recent years, light-emitting diodes (LEDs) have become popular in general and commercial lighting applications. As light sources, LEDs have many advantages including lower energy consumption, longer lifetime, smaller size, and faster switching, and hence conventional lighting, such as incandescent lighting, is gradually replaced by LED lights.

SUMMARY

The embodiments of the present invention provide micro-light emitting diodes having two layers, which are a reflective layer and a bonding layer. The reflective layer has a melting point higher than a bonding temperature of an adhesive bonding system formed by the bonding layer. With appropriate conditions such as temperature and pressure, micro-light emitting diodes can be bonded on certain area of the substrate.

According to one aspect of this invention, a micro-light emitting diode (micro-LED) device includes a receiving substrate and a micro-LED. The micro-LED includes a first type semiconductor layer, a second type semiconductor layer, a current controlling layer, at least one reflective layer, and at least one first electrode. The second type semiconductor layer is joined with the first type semiconductor layer. The current controlling layer is joined with at least one of the first type semiconductor layer and the second type semiconductor layer, the current controlling layer having at least one opening therein. The reflective layer electrically is coupled with the first type semiconductor layer. The first electrode is disposed on a surface of the reflective layer facing the receiving substrate. The first electrode forms an adhesive bonding system with the receiving substrate.

In one or more embodiments, a bonding temperature of the adhesive bonding system is lower than a melting point of the reflective layer.

In one or more embodiments, the receiving substrate includes a bonding electrode, and the bonding electrode and the first electrode form the adhesive bonding system.

In one or more embodiments, the adhesive bonding system is a eutectic system, a soldering contact, a transient liquid phase sintering system, or a conductive adhesive bonding system formed by the bonding electrode and the first electrode, and the bonding temperature of the adhesive bonding system is a eutectic point of the eutectic system, a soldering point of the soldering contact, a sintering point of the transient liquid phase sintering system, or a conductive adhesive bonding temperature of the conductive adhesive bonding system.

In one or more embodiments, the first type semiconductor layer is electrically coupled with the first electrode through the opening of the current controlling layer, and a contact area between the first electrode and the bonding electrode is greater than a size of the opening.

In one or more embodiments, the bonding electrode is a metal layer, a transparent conductive layer, or a conductive adhesive layer.

In one or more embodiments, the first electrode is a metal layer or a conductive adhesive layer.

In one or more embodiments, a plurality of the reflective layers are stacked together.

In one or more embodiments, a plurality of the first electrodes are stacked together.

In one or more embodiments, the current controlling layer is a dielectric layer.

In one or more embodiments, the micro-LED includes a second electrode electrically coupled with the second type semiconductor layer, and said one of the first type semiconductor layer and the second type semiconductor layer is electrically coupled with one of the first electrode and the second electrode correspondingly through the opening of the current controlling layer.

In one or more embodiments, said one of the first type semiconductor layer and the second type semiconductor layer has a resistivity $\rho_s$ and a thickness $t_s$, the other of the first type semiconductor layer and the second type semiconductor layer has a resistivity $\rho_o$ and a thickness $t_o$, and $$\sqrt{\frac{t_s}{\rho_s}} < \sqrt{\frac{t_o}{\rho_o}}.$$

In one or more embodiments, the reflective layer is made of metal.

In one or more embodiments, the micro-LED includes an active layer disposed between the first type semiconductor layer and the second type semiconductor layer, and the current controlling layer is disposed between at least a part of said one of the first type semiconductor layer and the second type semiconductor layer and the active layer.

In one or more embodiments, the current controlling layer contacts the active layer.

In one or more embodiments, the current controlling layer is disposed in said one of the first type semiconductor layer and the second type semiconductor layer without contacting the active layer.

In one or more embodiments, the micro-LED includes an additional current controlling layer joined with the other of the first type semiconductor layer and the second type semiconductor layer and having at least one opening therein.

In one or more embodiments, the micro-LED includes an ohmic contact layer disposed between the first type semiconductor layer and the first electrode.

In one or more embodiments, the micro-LED includes a second electrode electrically connected with the second type semiconductor layer and an ohmic contact layer disposed between the second type semiconductor layer and the second electrode.

According to one aspect of this invention, a micro-LED includes a first type semiconductor layer, a second type semiconductor layer, a current controlling layer, at least one reflective layer, and at least one first electrode. The second type semiconductor layer is joined with the first type semiconductor layer. The current controlling layer is joined with one of the first type semiconductor layer and the second type semiconductor layer, the current controlling layer having at least one opening therein. The reflective layer is electrically coupled with the first type semiconductor layer. The first electrode is disposed on a surface of the reflective layer facing a receiving substrate. The first electrode forms an adhesive bonding system with the receiving substrate.

In one or more embodiments, a bonding temperature of the adhesive bonding system is lower than a melting point of the reflective layer.

In one or more embodiments, the adhesive bonding system is a eutectic system, a soldering contact, a transient liquid phase sintering system, or a conductive adhesives bonding system, and the bonding temperature of the adhesive bonding system is a eutectic point of the eutectic system, a soldering point of the soldering contact, a sintering point of the transient liquid phase sintering system, or a conductive adhesive bonding temperature of the conductive adhesive bonding system.

It is to be understood that both the foregoing general description and the following detailed description are by examples, and are intended to provide further explanation of the invention as claimed.

DETAILED DESCRIPTION

Figure 1A:
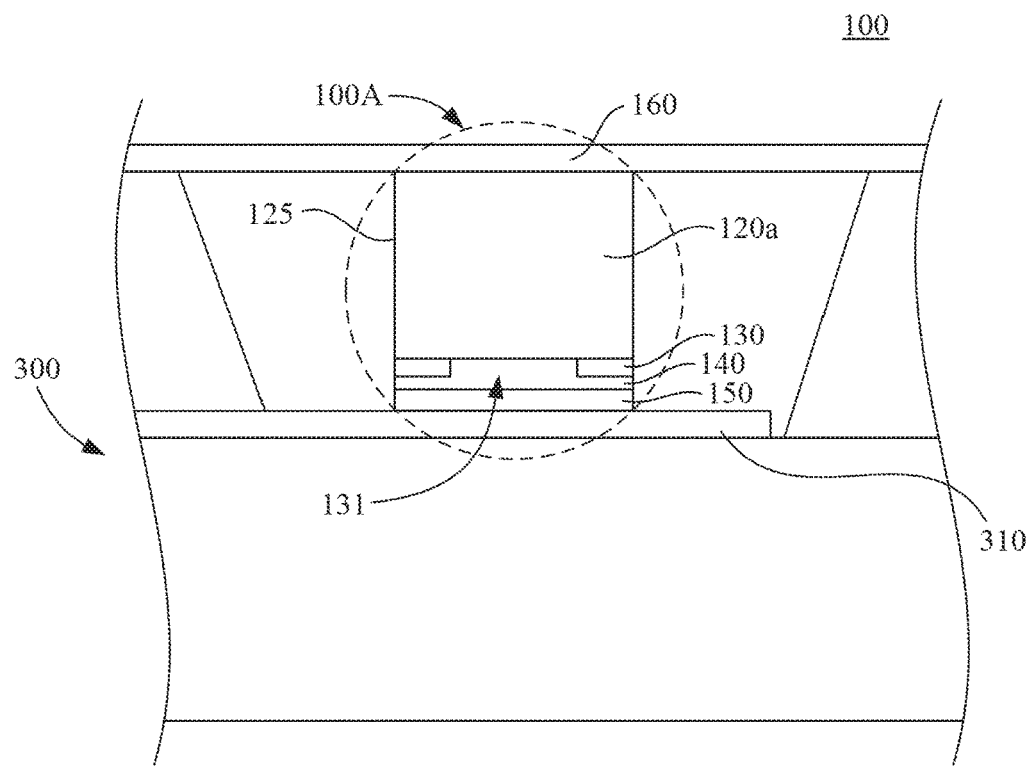
FIG. 1A is a cross-sectional view of a micro-light-emitting diode (micro-LED) device according to an embodiment of this invention.

In the following detailed description, for purposes of explanation, numerous specific details are set forth in order to provide a thorough understanding of the disclosed embodiments. It will be apparent, however, that one or more embodiments may be practiced without these specific details.

In other instances, well-known structures and devices are schematically shown in order to simplify the drawing.

Embodiments of the present invention describe micro semiconductor devices and a method of forming an array of micro semiconductor devices such as micro-light-emitting diodes (micro-LEDs) for transfer to a receiving substrate. For example, the receiving substrate may be, but is not limited to, a display substrate.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "in an embodiment" or the like in various places throughout this specification are not necessarily referring to the same embodiment of the invention.

Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "micro" device, "micro" p-n diode or "micro" LED structure as used herein may refer to the descriptive size of certain devices or structures according to embodiments of the invention. As used herein, the terms "micro" devices or structures are meant to refer to the scale of 1 to 100 μm. However, it is to be appreciated that embodiments of the present invention are not necessarily so limited, and that certain aspects of the embodiments may be applicable to larger, and possibly smaller size scales.

Some embodiments of the invention describe a method of processing a bulk LED substrate into an array of micro-LEDs which are poised for pick up and transfer to a receiving substrate. In this manner, it is possible to integrate and assemble micro-LEDs into heterogeneously integrated systems. The micro-LEDs can be picked up and transferred individually, in groups, or as the entire array. Thus, the micro-LEDs in the array of micro-LEDs are poised for pick up and transfer to a receiving substrate such as display substrate of any size ranging from micro displays to large area displays, and at high transfer rates. In some embodiments, arrays of micro-LEDs which are poised for transfer are described as having a fine pitch and each micro LED has a regular octagon shape with the pitch size of 10 um. Thus a 4-inch LED epi wafer could be divided into an micro LED array which contains more than 27 million devices. Thus, a high density of pre-fabricated micro devices with a specific functionality may be produced in a manner in which they are poised for pick up and transfer to a receiving substrate.

FIG. 1A is a cross-sectional view of a micro-light-emitting diode (micro-LED) device 100 according to an embodiment of this invention. The micro-light emitting diode device 100 includes a receiving substrate 300 and a micro-LED 100A disposed on the receiving substrate 300.

The receiving substrate 300 is illustrated as a display substrate and may include at least one bonding electrode 310 joined with the micro-LED 100A, for example, but it should not limit the scope of the present invention. The receiving substrate 300 may be a display substrate without the bonding electrode 310. The details of the receiving substrate 300 can be referred to FIG. 7 and will be described in more detail in the following description.

Figure 1B:
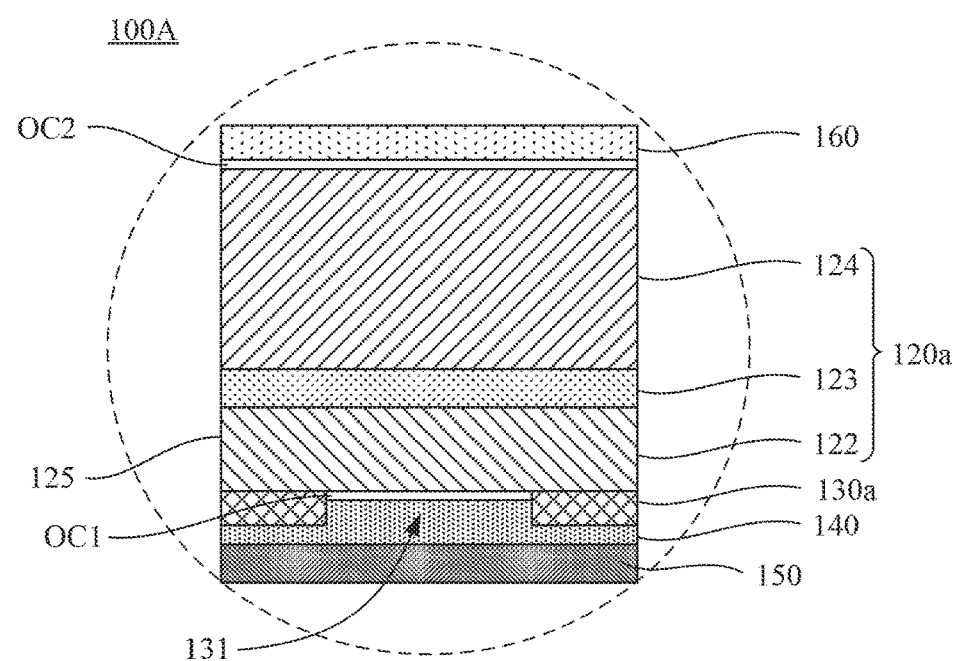
FIG. 1B is an enlarged cross-sectional view of the micro-LED in FIG. 1.

Reference is now made both to FIG. 1A and FIG. 1B. FIG. 1B is an enlarged cross-sectional view of the micro-LED 100A in FIG. 1A according to an embodiment of this invention. The micro-LED 100A includes a micro p-n diode 120a, a current controlling layer 130, a reflective layer 140, a first electrode 150, and a second electrode 160. The micro p-n diode 120a includes a first type semiconductor layer 122 (e.g., a p-type layer), an active layer 123, and a second type semiconductor layer 124 (e.g., an n-type layer). The second type semiconductor layer 124 is joined with the first type semiconductor layer 122. The active layer 123 is disposed between the first type semiconductor layer 122 and the second type semiconductor layer 124. The current controlling layer 130 is joined with one of the first type semiconductor layer 122 and the second type semiconductor layer 124, and has at least one opening 131 therein. The reflective layer 140 is electrically coupled with the first type semiconductor layer 122. The first electrode 150 is disposed on a surface of the reflective layer 140 facing the receiving substrate 300. The first electrode 150 forms an adhesive bonding system with the receiving substrate 300.

In one or more embodiments, the current controlling layer 130 may be disposed at a side of the micro p-n diodes 120a proximal or distal to the receiving substrate 300. In some embodiments, the current controlling layer 130 may be disposed in the one of the first type semiconductor layer 122 and the second type semiconductor layer 124 with or without contacting the active layer 123. In this embodiment, the current controlling layer 130 is disposed at a side of the micro p-n diodes 120a proximal to the receiving substrate 300, but it should not limit the scope of the present invention. The embodiments of FIG. 3A-6G present different configurations of the current controlling layer 130.

Among the configuration of the micro-LED 100A, the reflective layer 140 and the first electrode 150 are configured for offering different functions. The reflective layer 140 can reflect the light emitted from the semiconductor stack, and therefore the micro-LED 100A can emit light upwards to enhance the light intensity. The first electrode 150 is used for bonding micro-LED 100A with the receiving substrate 300.

The micro-LED 100A and the micro-LED device 100 shown in FIG. 1A can be manufactured according to operations sequentially illustrated by FIG. 2C-2J, for example.

Figure 2A:
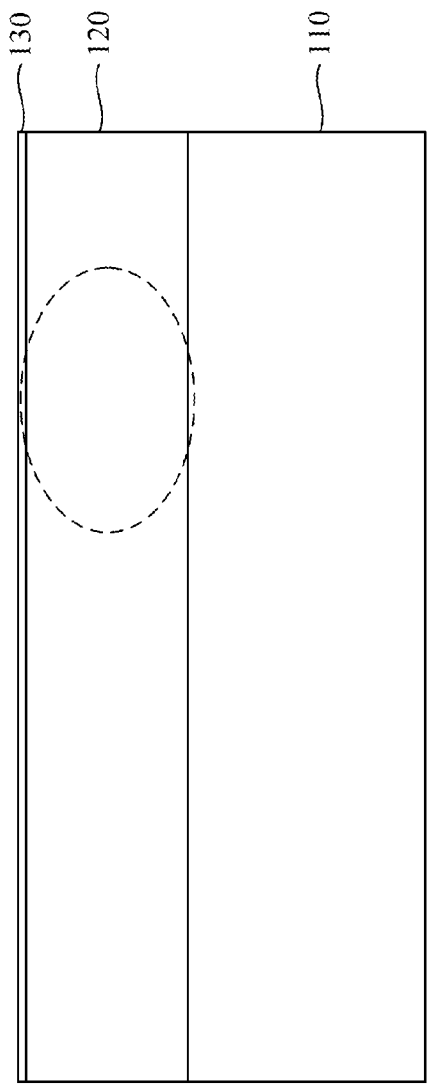
FIG. 2A is a cross-sectional side view illustration of a bulk LED substrate according to an embodiment of the invention.

FIG. 2A is a cross-sectional side view illustration of a bulk LED substrate according to an embodiment of the invention. Referring now to FIG. 2A, a semiconductor device layer 120 is formed on a growth substrate 110, and a current controlling layer 130 is formed on the semiconductor device layer 120. In an embodiment, the semiconductor device layer 120 may not be fully functional. For example, contacts such as an anode or cathode may not yet be formed. In the interest of conciseness and to not obscure embodiments of the invention, the following description is made with regard to the semiconductor device layer 120 as a p-n diode layer 120 grown on the growth substrate 110 according to conventional heterogeneous growth conditions.

The p-n diode layer 120 may include a compound semiconductor having a bandgap corresponding to a specific region in the spectrum. For example, the p-n diode layer 120 may include one or more layers based on II-VI materials (e.g. ZnSe, ZnO) or III-V nitride materials (e.g. GaN, AlN, InN, InGaN, GaP, AlInGaP, AlGaAs, and their alloys). The growth substrate 110 may include any suitable substrate such as, but not limited to, silicon, SiC, GaAs, GaN and sapphire ($Al_2O_3$).

In a particular embodiment, the growth substrate 110 is sapphire, and the p-n diode layer 120 is formed of GaN. Despite the fact that sapphire has a larger lattice constant and thermal expansion coefficient mismatch with respect to GaN, sapphire is reasonably low cost, widely available and its transparency is compatible with laser lift-off (LLO) techniques. In another embodiment, another material such as SiC may be used as the growth substrate 110 for the GaN p-n diode layer 120. Like sapphire, SiC substrates may be transparent. Several growth techniques may be used for growth of the p-n diode layer 120 such as metal organic chemical vapor deposition (MOCVD).

Figure 2B:
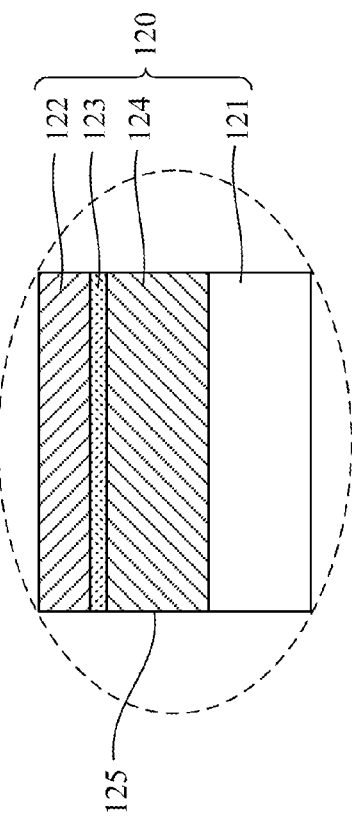
FIG. 2B is an enlarged section of the p-n diode layer in FIG. 2A.

FIG. 2B is an enlarged section of the p-n diode layer 120 in FIG. 2A. In the particular embodiment illustrated in FIG. 2B, the p-n diode layer 120 may include a first type semiconductor layer 122 (e.g., a p-doped layer), an active layer 123, a second type semiconductor layer 124 (e.g., an n-doped layer), and a bulk GaN layer 121. In some embodiments, the bulk GaN layer 121 is optionally not formed in the p-n diode layer 120, so the following operation of removing the bulk GaN layer 121 (i.e., the operation illustrated in FIG. 2H) can be omitted. The bulk GaN layer 121 may be undoped GaN n-doped by silicon or oxygen contamination, or intentionally doped with a donor such as silicon. The second type semiconductor layer 124 may likewise be doped with a donor such as silicon, while the first type semiconductor layer 122 may be doped with an acceptor such as magnesium. A variety of alternative p-n diode configurations may be utilized to form the p-n diode layer 120. Likewise, a simple p-n contact junction or a variety of single quantum well (SQW) or multiple quantum well (MQW) configurations may be utilized to form the active layer 123. In addition, various buffer layers may be included as appropriate.

In one embodiment, the sapphire growth substrate 110 has a thickness of approximately 100 μm-400 μm, the buffer bulk GaN layer 121 has a thickness of approximately 3 μm-5 μm, the second type semiconductor layer 124 has a thickness of approximately 0.1 μm-5 μm, the active layer 123 has a thickness less than approximately 100-400 nm, and the first type semiconductor layer 122 has a thickness of approximately 100 nm-1 μm.

In some embodiments, the second type semiconductor layer 124 may has a thickness of approximately 0.1 μm-50 μm, the active layer 123 (which may be SQW or MQW) with a thickness approximately 50 nm-5 μm, and the first type semiconductor layer 122 may has a thickness of approximately 50 nm-20 μm. In an embodiment, the second type semiconductor layer 124 may has a thickness in a range from 0.1 μm to 6 μm (which may include or replace buffer bulk layer 121).

Figure 2C:
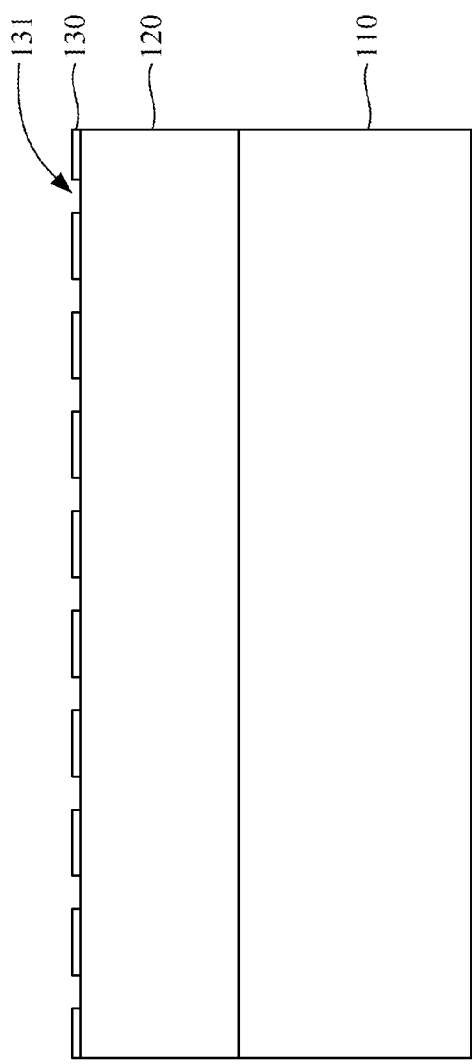
FIG. 2C is a cross-sectional side view illustration of a patterned current controlling layer formed on the p-n diode layer in FIG. 2A according to an embodiment of the invention.

FIG. 2C is a cross-sectional side view illustration of a patterned the current controlling layer 130 formed on the p-n diode layer 120 in FIG. 2A according to an embodiment of the invention. Referring now to FIG. 2C, a plurality of openings 131 are formed within the current controlling layer 130. The opening 131 of the current controlling layer 130 can have different shapes, such as circles, quadrangles, hexagons, octagons, or other polygons. In the embodiment of the invention, after a plurality of the micro-LEDs 100A are manufactured (as described in the following description), each of the micro-LEDs 100A has one opening 131, but the invention is not limited in this regard. In some embodiments, after a plurality of the micro-LEDs 100A are manufactured, each of the micro-LEDs 100A may have more than one opening 131.

Figure 2D:
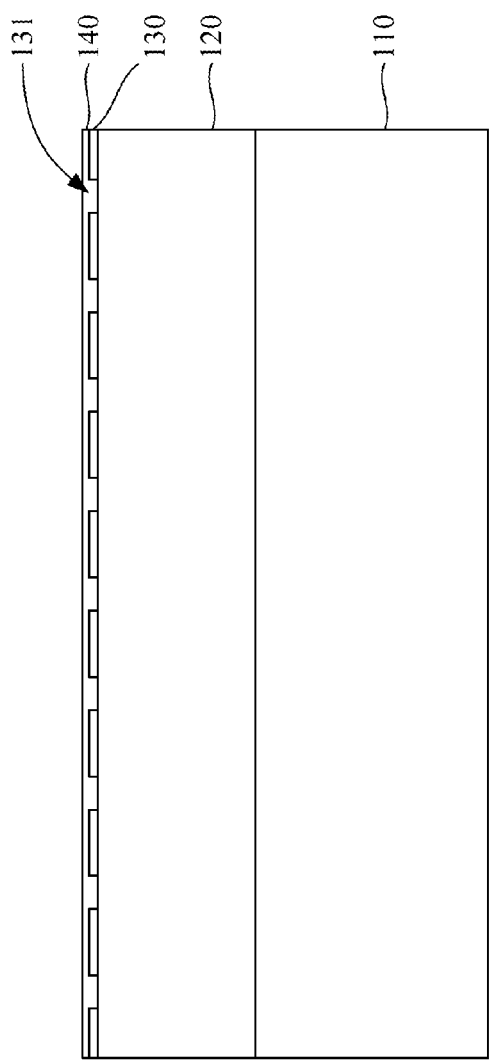
FIG. 2D is a cross-sectional side view illustration of a reflective layer formed on the patterned first current controlling layer in FIG. 2C according to an embodiment of the invention.

FIG. 2D is a cross-sectional side view illustration of a reflective layer 140 formed on the patterned current controlling layer 130 in FIG. 2C according to an embodiment of the invention. Referring now to FIG. 2D, a reflective layer 140 may then be formed over the current controlling layer 130. The reflective layer 140 is electrically coupled with the exposed parts of the first type semiconductor layer 122 (as shown in FIG. 1B) of the p-n diode layer 120 through the openings 131. In some embodiments, the reflective layer 140 has a high reflectance at visible wavelength, so that light emitted from the p-n diode layer 120 is reflected by the reflective layer 140.

Figure 2E:
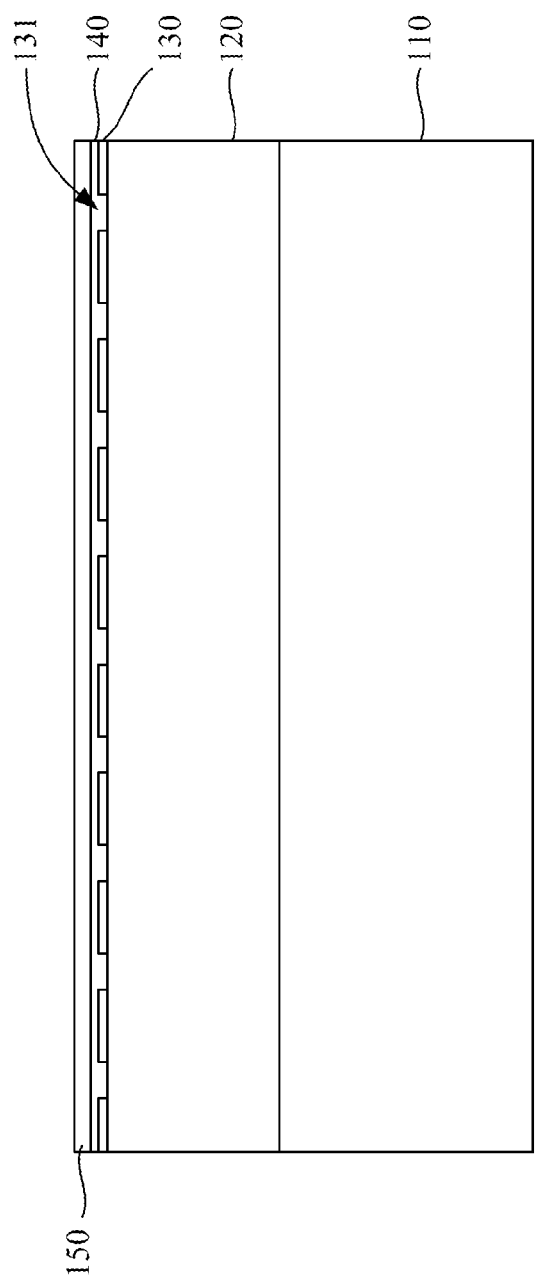
FIG. 2E is a cross-sectional side view illustration of a first electrode formed on the reflective layer in FIG. 2D according to an embodiment of the invention.

FIG. 2E is a cross-sectional side view illustration of a first electrode 150 formed on the reflective layer 140 in FIG. 2D according to an embodiment of the invention. Referring now to FIG. 2E, a first electrode 150 may then be formed over the reflective layer 140. The first electrode 150 is electrically connected with the reflective layer 140, and therefore the first type semiconductor layer 122 is electrically coupled with the first electrode 150 through the opening 131 of the current controlling layer 130. The reflective layer 140 and the first electrode 150 serve as electrode layers, though other layers may be included. In an embodiment, a sum of the thickness of the reflective layer 140 and the first electrode 150 is in a range from about 1 to about 15 micrometers.

Figure 2F:
FIG. 2F is a cross-sectional side view illustration of a carrier substrate with an adhesive layer according to an embodiment of the invention.
Figure 2G:
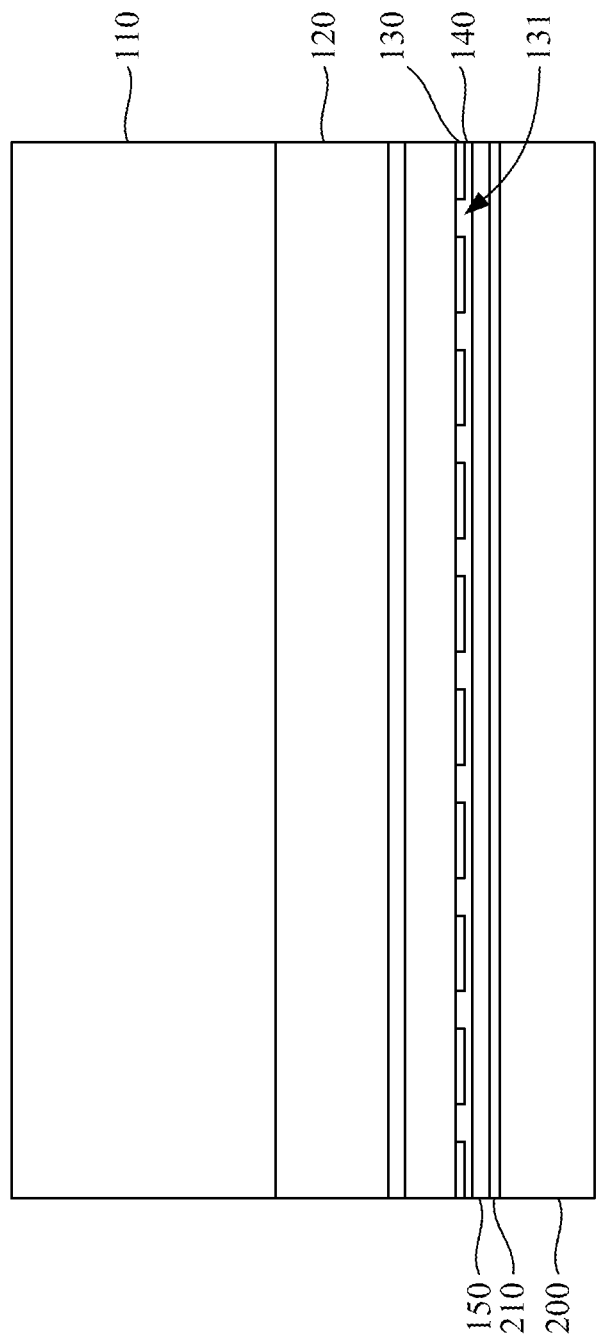
FIG. 2G is a cross-sectional side view illustration of bonding the structure of FIG. 2E and the structure of FIG. 2F together according to an embodiment of the invention.

FIG. 2F is a cross-sectional side view illustration of a carrier substrate 200 with an adhesive layer 210 according to an embodiment of the invention. FIG. 2G is a cross-sectional side view illustration of bonding the structure of FIG. 2E and the structure of FIG. 2F together according to an embodiment of the invention. According to certain embodiments of the invention, a combination of the p-n diode layer 120, the current controlling layer 130, the reflective layer 140, and the first electrode 150 grown on the growth substrate 110 is subsequently transferred to a carrier substrate 200 before chipped, such as one illustrated in FIG. 2G and described in more detail in the following description. In some embodiments, the first electrode 150, the reflective layer 140, and the p-n diode layer 120 may be chipped prior to transfer to a carrier substrate 200. Accordingly, embodiments of the invention may be implemented in a multitude of variations during formation of an array of micro-LEDs 100A for subsequent transfer to the receiving substrate 300.

In an embodiment, the adhesive layer 210 may have a thickness of approximately 0.1 μm-100 μm.

The adhesive layer 210 may be made of adhesion capable organic or non-organic materials, e.g., UV curable glue or silicone. The adhesive layer 210 may be formed from a material which is capable of adhering the combination of the p-n diode layer 120, the current controlling layer 130, the reflective layer 140, and the first electrode 150 to the carrier substrate 200. Specifically, the adhesion force of the adhesive layer 210 could be adjusted or reduced by an electric field, UV light, electromagnetic radiation, heat, ultrasound, mechanical force, pressure, or any combinations thereof. Referring now to FIG. 2G, the combination of the p-n diode layer 120, the current controlling layer 130, the reflective layer 140, and the first electrode 150 and the carrier substrate 200 may be bonded together by using the adhesive layer 210.

Figure 2H:
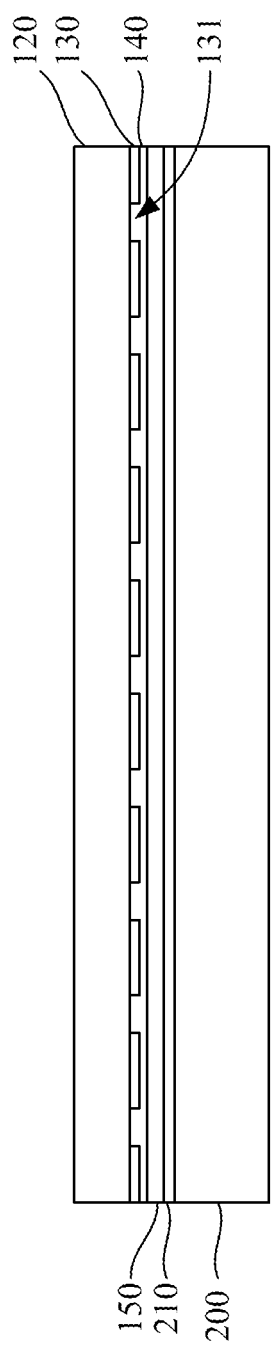
FIG. 2H is a cross-sectional side view illustration of removing the growth substrate from the bonded structure in FIG. 2G and thinning-down the p-n diode layer according to an embodiment of the invention.

FIG. 2H is a cross-sectional side view illustration of removing the growth substrate 110 from the bonded structure in FIG. 2G and thinning-down the p-n diode layer 120 according to an embodiment of the invention. Referring now to FIG. 2H, the growth substrate 110 has been removed from the bonded structure. The growth substrate 110 may be removed by a suitable method such as chemical lift-off or laser lift-off (LLO). While using LLO, the absorption in the GaN p-n diode layer 120 at the interlace results in localized heating of the interface resulting in decomposition at the interfacial GaN to liquid Ga metal and nitrogen gas. Once the desired area has been irradiated, the transparent sapphire growth substrate 110 can be removed by remelting the Ga on a hotplate.

Referring now to FIG. 2H, the p-n diode layer 120 is then thinned down to a desirable thickness. Referring back to the enlarged p-n diode layer 120 in FIG. 2B, a predetermined amount of the buffer bulk GaN layer 121 (which may be n-type) or a portion of the second type semiconductor layer 124 are removed so that an operable p-n diode remains after thinning. The buffer bulk GaN layer 121 can be fully etched. Alternatively, the buffer bulk GaN layer 121 can be partially etched to form contact holes via which the second type semiconductor layer 124 can be electrically coupled with the second electrode 160 shown in FIG. 1A. In some embodiments, the buffer bulk GaN layer 121 is optionally not formed in the p-n diode layer 120, so the operation of removing the buffer bulk GaN layer 121 (i.e., the operation illustrated in FIG. 2H) can be omitted. Depending upon the underlying structure, the thinning process may be performed optionally utilizing suitable techniques such as dry etching to etch the buffer bulk GaN layer 121.

Figure 2I:
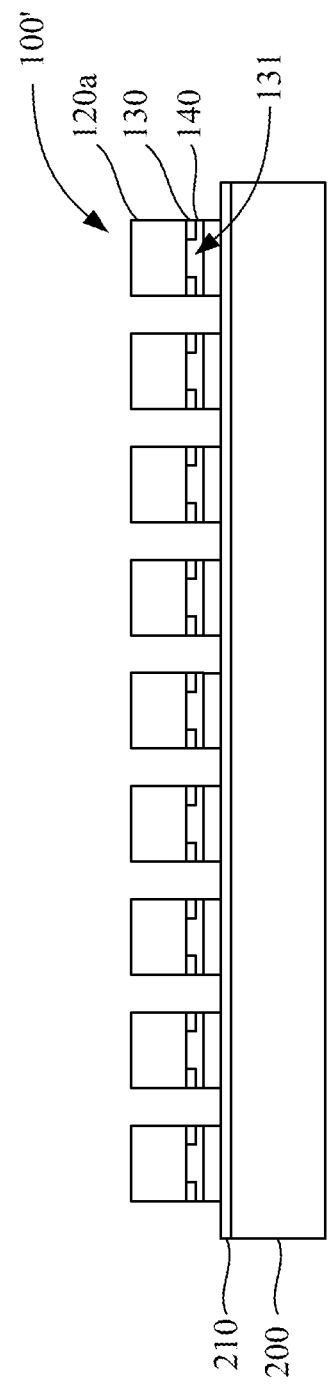
FIG. 2I is a cross-sectional side view illustration of etching the p-n diode layer, the reflective layer, and the first electrode in FIG. 2H to form micro p-n diodes according to an embodiment of the invention.

FIG. 2I is a cross-sectional side view illustration of etching the p-n diode layer 120, the reflective layer 140, and the first electrode 150 in FIG. 2G to form micro p-n diodes 120a according to an embodiment of the invention. Referring now to FIG. 2H, the plurality of micro p-n diodes 120a are positioned over the adhesive layer 210. In the embodiment, the micro p-n diodes 120a have vertical sidewalls. For example, ICP (Inductively Coupled Plasma) which a chlorine-based etch chemistry may be utilized to obtain vertical sidewalls. Meanwhile, the reflective layer 140 and the first electrode 150 may be etched and patterned by certain acid solution, for example hydrochloric acid, nitric acid and aqua regia.

Figure 2J:
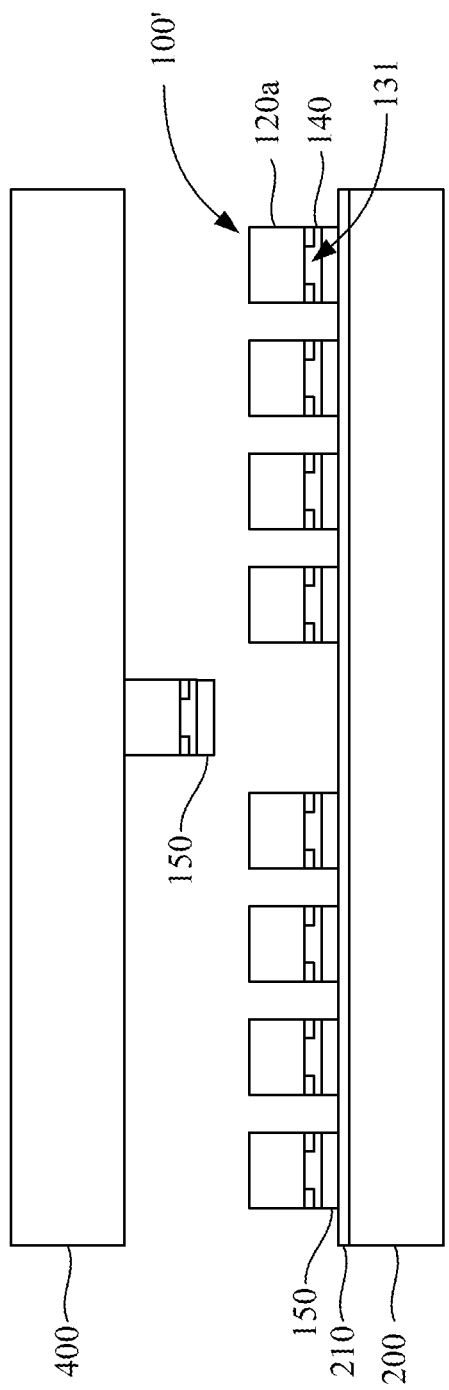
FIG. 2J is a cross-sectional side view illustration of a transfer head picking up a micro-LED from the carrier substrate in FIG. 2I according to an embodiment of the invention.

FIG. 2J is a cross-sectional side view illustration of a transfer head 400 picking up a micro-LED 100' from the carrier substrate 200 in FIG. 2I according to an embodiment of the invention. Referring now to FIG. 2J, the micro-LEDs 100' or array of micro-LEDs 100' in FIG. 2J are poised for pick up and transfer to the receiving substrate 300 illustrated in FIG. 1A, for example with a transfer head 400.

In some embodiments, the Young's modulus of the adhesive layer 210 is less than or equal to 30 GPa. As a result, the adhesive layer 210 may absorb the mechanical impact forces associated with contacting the micro-LEDs 100' with a transfer head 400 during the pick up process.

Referring back to FIG. 2I, the carrier substrate 200 is provided having an array of micro-LEDs 100' disposed thereon. Each micro-LED 100' may at least include the micro p-n diode 120a, the current controlling layer 130 having at least one opening 131, the reflective layer 140, and the first electrode 150. To transfer the micro-LED 100' to the receiving substrate 300 illustrated in FIG. 1A, the adhesion force of the adhesive layer 210 is decreased by an electric field, UV light, electromagnetic radiation, heat, ultrasound, mechanical force, pressure, or any combinations thereof in advance. A combination of the micro p-n diode 120a, the current controlling layer 130, the reflective layer 140, and the first electrode 150 is then be picked up with the transfer head 400 and then placed on the receiving substrate 300.

A variety of suitable transfer heads can be utilized to aid in the pick up and placement operations according to embodiments of the invention. For example, the transfer head 400 may exert a pick up pressure on the micro-LED 100' according to vacuum, adhesion, magnetic, or electrostatic attraction in order to pick up the micro-LED 100'.

Reference is now made back to FIG. 1A, which is an illustration of the receiving substrate 300 onto which a micro-LED 100A has been placed. In the embodiment, the receiving substrate 300 is a display substrate. In the particular embodiment illustrated, the micro-LED 100' shown in FIG. 2J may be placed over the bonding electrode 310 of the receiving substrate 300. The first electrode 150 and the bonding electrode 310 are bonded together and form an adhesive bonding system through a bonding process. Then, a second electrode 160 may then be formed over the micro p-n diode 120a and electrically connected to the second type semiconductor layer 124 (refer to FIG. 1B), so as to form the micro-LED device 100.

The bonding process may include procedures of heating and cooling the first electrode 150 and/or the bonding electrode 310 for phase transition. Depending on the materials and compositions of the first electrode 150 and/or the bonding electrode 310, due to solid state equilibrium, the adhesive bonding system formed by the first electrode 150 and/or the bonding electrode 310 can have a relatively low bonding temperature. For example, the adhesive bonding system can be a eutectic system, a soldering contact, a transient liquid phase sintering system, even a conductive adhesive bonding systems, or the combination of above systems. The bonding temperature, such as a eutectic point, a soldering point, a sintering point, or a conductive adhesive bonding temperature, is relatively low in the eutectic system, the soldering contact, the TLPS system, or the conductive adhesive bonding system.

In some embodiments in which the adhesive bonding system is the eutectic system or the soldering contact, the phase of the first electrode 150 and/or the bonding electrode 310 is changed between solid and liquid to establish the structural connection therebetween. The eutectic point, the soldering point, the sintering point, or the conductive adhesive bonding temperature is lower than a melting point of one of the materials of the reflective layer 140 and the first electrode 150.

The materials and compositions of the reflective layer 140 and the first electrode 150 are chosen adequately to establish the adhesive bonding system. For example, the first electrode 150 can be made of gold, indium, tin, silver, bismuth, lead, gallium, cadmium or any combinations or alloys thereof. Some portion of the bonding electrode 310 can be the similar matters as the material of the first electrode 150. On the other hand, the material of the bonding electrode 310 can be different from the material of the first electrode 150 but still has the ability to form the adhesive bonding system with the first electrode 150.

To be specific, for the eutectic system, in some embodiments, the first electrode 150 and the bonding electrode 310 can be made of a mixture of indium and gold or a mixture of indium and silver with a determined ratio. For the soldering contact, the first electrode 150 and the bonding electrode 310 can both made of solder. For the TLPS system, the bonding electrode 310 and the first electrode 150 can be made of metal and solder respectively, such as silver and bismuth-tin alloy with a determined ratio, and the first electrode 150 and the bonding electrode 310 can bond and permeate together. For the conductive adhesive bonding system, the bonding electrode 310 and the first electrode 150 can be conductive adhesives, such as silver epoxy. As is known in the art, the bonding electrode 310 and the first electrode 150 can be made of various materials, and the detail illustration is omitted herein.

In one or more embodiments of the present invention, the eutectic point of the eutectic system or the soldering point of the soldering contact is higher than 90 degrees on the Celsius scale. The sintering point of the TLPS system may be in a range from 100 degrees to 300 degrees on the Celsius scale. The bonding electrode 310 and the first electrode 150 can be metal layers, transparent conductive layers, or conductive adhesive layers.

In one or more embodiments of the present invention, a flux (not shown) can be optionally applied onto the first electrode 150 or the bonding electrode 310 in the bonding process. The flux can be hydrochloric acid, zinc chloride, borax, or ammonium chloride depending on the material of the first electrode 150 or the bonding electrode 310. The flux may clean the first electrode 150 or the bonding electrode 310, prevent the oxidation in the bonding process, and further improve the formation of the adhesion bonding system.

Since the first electrode 150 is proximate to the reflective layer 140, the heat of the bonding process may transfer from the first electrode 150 to the reflective layer 140, and thus may cause the reflective layer 140 to melt. In this embodiment, the bonding temperature of the adhesive bonding system, such as the eutectic point of the eutectic system, the soldering point of the soldering contact, and the sintering point of the TLPS process, is lower than a melting point of the reflective layer 140. In this way, the reflective layer 140 can be prevented from melting when the first electrode 150 and the bonding electrode 310 are bonding together. In some embodiments, the melting point of the reflective layer 330 designed to be higher than about 300 degrees on the Celsius scale. In some embodiments, the reflective layer 140 can be made of metal, such as aluminum, silver, nickel, platinum, titanium, palladium, gold, copper, ruthenium or any combinations or alloys thereof.

Reference is now made to FIG. 1A and FIG. 1B. In one or more embodiments of the present invention, the reflective layer 140 and the first electrode 150 can be formed by plural layers. That is, plural reflective layers 140 are stacked together, and the first electrodes 150 are stacked together.

In some embodiments, the second electrode 160 is formed from a transparent contact materials such as indium tin oxide (ITO). In some embodiments, the second electrode 160 is in the form of a bonding wire. The second electrode 160 can also be formed by plural layers. That is, plural second electrodes 160 are stacked together.

In one or more embodiments of the present invention, the reflective layer 140 and the first electrode 150 have a sum thickness in a range from about 1 to about 15 micrometers, as illustrated above, and the configuration provides supporting and keeps the p-n diode 120a from cracking. In the assembly process, certain stress applied on the micro-LED device 100 may bring destruction since the p-n diode 120a of the micro-LED 100A has a thickness in a range from about 1 to about 20 micrometers, which is too thin to bear the stress.

In this embodiment, since the reflective layer 140 and the first electrode 150 is comparable in thickness to the p-n diode 120a, the pressure on the micro-LED 100A is not centralized at the p-n diode 120a but can be shared by the reflective layer 140 and the first electrode 150. Then, the stress applied on the p-n diode 120a becomes less. Therefore, the reflective layer 140 and the first electrode 150 can keep the p-n diode 120a from cracking under the pressure.

Reference is now made to FIG. 1B. In some embodiment, the second electrode 160 has a light-permeable part. Specifically, in the embodiment, a vertical projection of the current controlling layer 130 on the second electrode 160 overlaps with the light-permeable part. The light-permeable part is transparent or semi-transparent. In some embodiments, a vertical projection of the opening 131 of the current controlling layer 130 on the second electrode 160 overlaps with the light-permeable part. In some embodiments, the second electrode 160 having the light-permeable part is wholly transparent.

As shown in FIG. 1B, the opening 131 of the current controlling layer 130 defines the contact interface between the reflective layer 140 and the first type semiconductor layer 122. When the micro-LED 100A is forward biased, charge carriers flow from the contact area between the reflective layer 140 and the first type semiconductor layer 122 to the junction of the first type semiconductor layer 122 and the second type semiconductor layer 124 (i.e., the active layer 123).

It is noted that a conventional current blocking layer disposed in a conventional LED is used to prevent the current from flowing through the opaque portion of the electrode of the LED. In some embodiment, the location of the current blocking layer may be right aligned with the opaque portion of the electrode of the LED. In order to make good use of the whole emitting area of the LED, the area of the current blocking layer can be as small as possible.

On the contrary, the micro-LED 100A of the invention uses the current controlling layer 130 to limit the emitting area of the micro-LED 100A. Compared with the conventional current blocking layer, the vertical projection of the current controlling layer 130 of the present invention on the second electrode 160 further overlaps with the light-permeable part of the second electrode 160. Since the opening 131 limits the area where the current goes into the micro-LED 100A, the current density within the emitting area of the micro-LED 100A increases and can be uniform, thereby increasing the operating stability and efficiency of the micro-LED 100A.

Furthermore, since the opening 131 of the current controlling layer 130 makes the emitting area of the micro-LED 100A smaller than the size of the micro-LED 100A, it is possible to continue miniaturization of the emitting area of the micro-LED 100A while remain the size of the micro-LED 100A to allow the micro-LED 100A to be easier to handling in the manufacturing process. For example, a 20 µm×20 µm micro-LED 100A with a 2 µm×2 µm opening can perform the similar light output characteristics as an ideal 2 µm×2 µm micro-LED.

Generally, when a micro LED having the p-n diode and the current controlling layer with the opening is bonded to a receiving substrate, due to the small size of the opening of the current controlling layer, the effective bonding area, which is the contact area between the p-n diode and the receiving substrate, is small, and a shift tolerance of a bonding process is low. In the present invention, with the configuration of the reflective layer 140 and the first electrode 150, the effective bonding area, which is the contact area between the first electrode 150 and the receiving substrate 300, is enlarged, and therefore the shift tolerance of the present bonding process is enhanced.

In some embodiments, the size of the micro-LED 100A is smaller than 100 µm×100 µm or 0.01 mm².

The current spreading length of lateral direction of a semiconductor layer of a diode is determined by the following equation I:

$$L_s = \sqrt{\frac{n_{ideal}KT}{\rho J_0 |e|}}, \qquad \text{Equation I}$$

where $L_s$ is the current spreading length of the semiconductor layer of the diode, t is the thickness of the semiconductor layer, $n_{ideal}$ is the ideality factor of the diode, K is the Boltzmann constant, T is the temperature of the semiconductor layer in Kelvin, ρ is the resistivity of the semiconductor layer, $J_0$ is the current density at the interface between the semiconductor layer and an electrode of the diode, and e is the electric charge of an electron.

As confirmed by the aforementioned equation I, the current spreading length of the semiconductor layer of the diode is proportional to $$\sqrt{\frac{t}{\rho}}.$$

Therefore, in some embodiments, the first type semiconductor layer 122 has a resistivity $\rho_1$ and a thickness $t_1$, the second type semiconductor layer 124 has a resistivity $\rho_2$ and a thickness $t_2$, and $$\sqrt{\frac{t_1}{\rho_1}} < \sqrt{\frac{t_2}{\rho_2}}$$

to make the current spreading length of the first type semiconductor layer 122 to be less than the current spreading length of the second type semiconductor layer 124.

Figure 11:
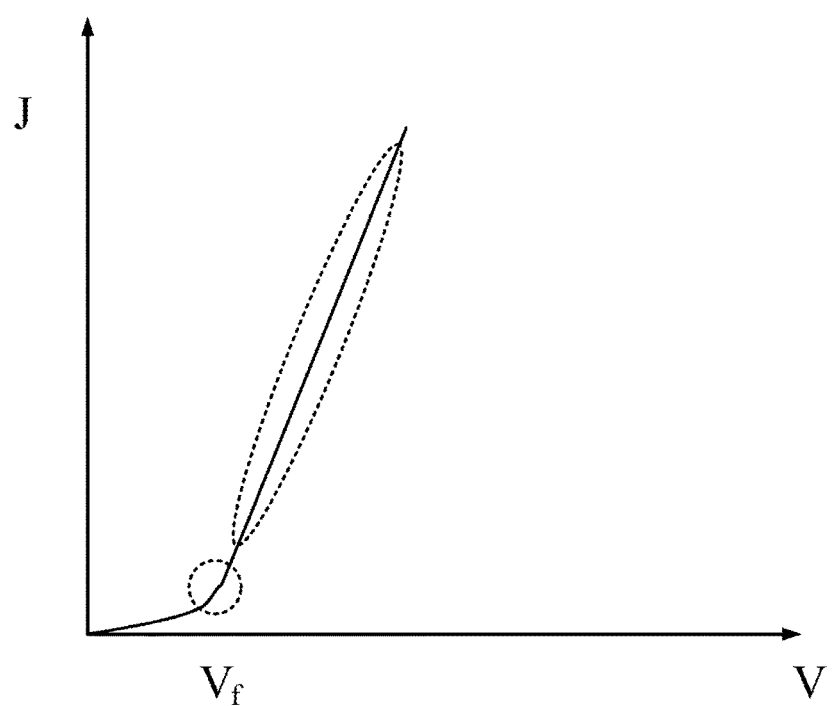
FIG. 11 illustrates a current density of the emitting area versus voltage JV curve of a micro-LED.

FIG. 11 illustrates a current density of the emitting area versus voltage JV curve of a micro-LED. In the mid/low power operation (i.e., at the region indicated by the dotted circle in FIG. 11, the operating of a conventional micro-LED is close to it's $V_f$ (threshold voltage), this makes reliability problems/or non-uniform characteristics among different micro-LEDs.

Therefore, in some embodiments, the current controlling layer 130 with the opening 131 is joined with the first type semiconductor layer 122, which has a short current spreading length. Since the first type semiconductor layer 122 has the short current spreading length, the first type semiconductor layer 122 for example has high resistivity and is thin in thickness, as illustrated in FIG. 1B. Furthermore, since the opening 131 of the current controlling layer 130 accompanied with the first type semiconductor layer 122 having the short current spreading length limits the area where the current goes into the micro-LED 100A, the emitting area of the micro-LED 100A can be decreased to be smaller than the area of the active layer 123 so as to provide an adequate brightness, and the current density within the emitting area of the micro-LED 100A increases. Since the current density of the micro-LED 100A increases, the micro-LED 100A can be operated in the linear power operation (i.e., at the region indicated by the dotted oval in FIG. 11). The result is the better reliability and a better uniform characteristic of the micro-LED 100A.

In some embodiments, the first type semiconductor layer 122 is made of, for example, p-doped GaN or p-doped AlGaInP. The thickness of the first type semiconductor layer 122 is in a range from 50 nm to 20 μm. The first type semiconductor layer 122 is formed by, for example, epitaxy.

As shown in FIG. 1B, in some embodiments, an ohmic contact layer OC1 may be added between the first type semiconductor layer 122 and the reflective layer 140 to reduce the contact potential between the reflective layer 140 and the first type semiconductor layer 122. The ohmic contact layer OC1 can be made of metal or a semiconductor material. The thickness of the ohmic contact layer OC1 is in a range from 5 nm to 2 μm. The thickness of the rest of the first type semiconductor layer 122 is in a range from 50 nm to 20 μm.

In some embodiments, the second type semiconductor layer 124 is made of, for example, n-doped GaN:Si. The thickness of the second type semiconductor layer 124 is in a range from 0.1 μm to 50 μm. The second type semiconductor layer 124 is formed by, for example, epitaxy.

Similarly, as shown in FIG. 1B, in some embodiments, another ohmic contact layer OC2 may be added between the second type semiconductor layer 124 and the second electrode 160 to reduce the contact resistance between the second electrode 160 and the second type semiconductor layer 124.

In some embodiments, the active layer 123 is made of, for example, p-n junction, heterostructure junction or quantum well structure.

The second electrode 160 of the micro-LED 100A shown in FIG. 1B is at least partially joined with the second type semiconductor layer 124, such that the first type semiconductor layer 122, the active layer 123, and the second type semiconductor layer 124 are disposed between the reflective layer 140 and the second electrode 160. Both the reflective layer 140 and the second electrode 160 are made of a conductive material, such as metal or a transparent conductive material, e.g., indium tin oxide (ITO). The reflective layer 140 and the second electrode 160 can be formed by, for example, physical vapor deposition (PVD) or chemical vapor deposition (CVD).

In addition, the second electrode 160 in the embodiment fully contacts the second type semiconductor layer 124, but the invention is not limited in this regard. In some embodiments, the second electrode 160 is in the form of a bonding wire and partially contacts the second type semiconductor layer 124.

In some embodiments, a combination of the first type semiconductor layer 122, the active layer 123, the second type semiconductor layer 124, and the current controlling layer 130 with the opening 131 is a solid with at least two planes. For example, the combination of the first type semiconductor layer 122, the active layer 123, the second type semiconductor layer 124, and the current controlling layer 130 with the opening 131 is a cylinder, a polyhedron, or a trapezoidal solid.

In some embodiments, the current controlling layer 130 is transparent. In some embodiments, the current controlling layer 130 is monochrome transparent. In some embodiments, the current controlling layer 130 is reflective. In some embodiments, the current controlling layer 130 is monochrome reflective.

In an embodiment, the current controlling layer 130 is a dielectric layer which is made of a dielectric material, such as silicon nitride or silicon dioxide. The thickness of the current controlling layer 130 is in a range from 1 nm to 5 μm. The current controlling layer 130 is formed by, for example, physical vapor deposition (PVD), CVD. However, the current controlling layer 130 of the invention is not limited to be a dielectric layer.

In some embodiments, the first type semiconductor layer 122 and the second type semiconductor layer 124 form a first p-n junction, the current controlling layer 130 and the first type semiconductor layer 122 form a second p-n junction, and the first electrode 150 and the second electrode 160 are configured to forward bias the first p-n junction while reverse bias the second p-n junction. In an embodiment, the first type semiconductor layer 122 is a p type semiconductor layer, and the second type semiconductor layer 124 and the current controlling layer 130 are n type semiconductor layers. In another embodiment, the first type semiconductor layer 122 is an n type semiconductor layer, and the second type semiconductor layer 124 and the current controlling layer 130 are p type semiconductor layers. As a result, no current will flow through the part of the active layer 123 corresponding to the current controlling layer 130, so that the part of the active layer 123 is prevented from emitting light.

Figure 3A:
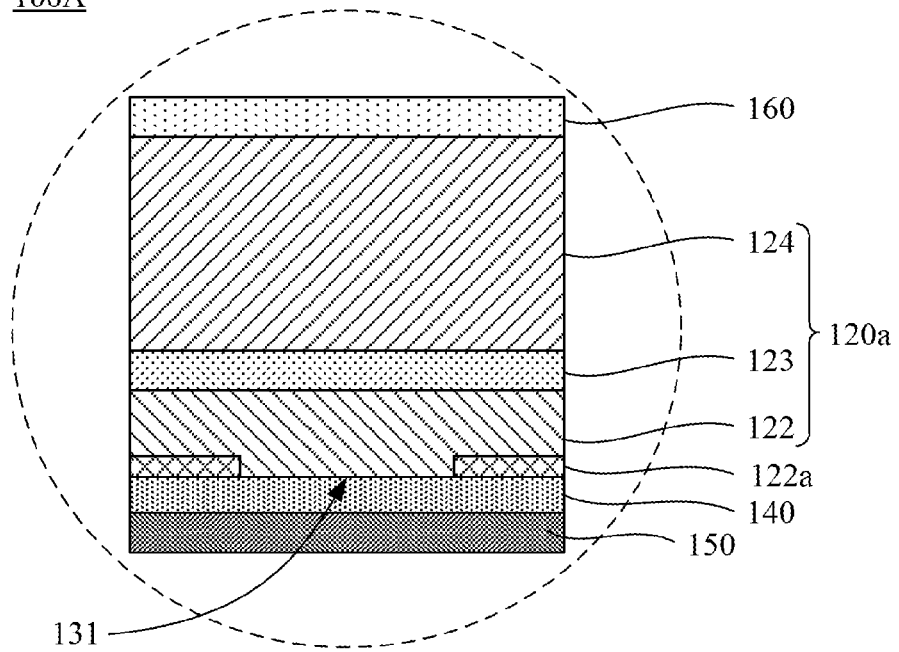
FIG. 3A is an enlarged cross-sectional view of the micro-LED according to an embodiment of this invention.

FIG. 3A is an enlarged cross-sectional view of the micro-LED 100A according to an embodiment of this invention. In an embodiment, the first type semiconductor layer 122 and the second type semiconductor layer 124 form a p-n junction, the current controlling layer 130 and the first type semiconductor layer 122 form a Schottky barrier. In the embodiment, the first type semiconductor layer 122 may consisted of heavily Mg-doped p-GaN or moderately Mg-doped p-GaN, for example. The current controlling layer 130 can be a plasma-treated portion of the first type semiconductor layer 122. To fabricate the current controlling layer 130, an Ar+ plasma treatment on the first type semiconductor layer 122 was performed using a predetermined working pressure, rf power, and a predetermined process time. The Schottky barrier were first fabricated on the treated surfaces of the first type semiconductor layer 122 using a Ni/Ag/Pt ohmic contact as the reflective layer 140. It is evident that the bias current of the Ni/Ag/Pt contact formed on the plasma-treated surfaces of the first type semiconductor layer 122 are nearly zero in the measured voltage range from −1 to 5V, while the plasma-untreated surfaces of the first type semiconductor layer 122 shows ohmic behavior. That is, the Ar+ plasma treatment to the first type semiconductor layer 122 led to the formation of a large barrier height. As a result, no current will flow through the part of the active layer 123 corresponding to the current controlling layer 130, so that the part of the active layer 123 is prevented from emitting light.

In some embodiments, the first type semiconductor layer 122 has the resistivity $\rho_1$ mentioned above, the current controlling layer 130 is a high resistivity layer which has a resistivity $\rho_h$, and $\rho_h > \rho_1$. For example, $\rho_h$ may be over 10 times greater than $\rho_1$, but the invention is not limited in this regard. In some embodiments, the current controlling layer 130 can be a semiconductor layer lighter doped or un-doped respect to the first type semiconductor layer 122, a semi-metal layer, a ceramic layer, or a semi-insulator layer. As a result, the current controlling layer 130 can control most of the current to flow through the opening 131 of the current controlling layer 130, so as to limit the emitting area of the active layer 123 at a part corresponding to the opening 131 as possible. For example, under the circumstances that the resistivity $\rho_h$ of the current controlling layer 130 is 10 times greater than the resistivity $\rho_1$ of the first type semiconductor layer 122, at least 50% current will flow through the opening 131 having relatively small area, so as to achieve the purpose of current control. Thus, the current density of the opening area is higher comparing to the other region.

In some embodiments, the first type semiconductor layer 122 is a p type semiconductor layer, the second type semiconductor layer 124 is an n type semiconductor layer, and the current controlling layer 130 is a hole blocking layer. The LUMO (Lowest Unoccupied Molecular Orbital) energy level of the current controlling layer 130 is lower than that of the first type semiconductor layer 122 for at least 0.2 eV, so as to block holes transporting from the first type semiconductor layer 122 to the active layer 123. As a result, the holes in the first type semiconductor layer 122 can only transport to the active layer 123 via the opening 131 of the current controlling layer 130. For example, the material of the current controlling layer 130 can be $Al_xGa_yN_{(1-x-y)}$ with superlattice structure.

In some embodiments, the first type semiconductor layer 122 is an n type semiconductor layer, the second type semiconductor layer 124 is a p type semiconductor layer, and the current controlling layer 130 is an electron blocking layer. The HOMO (Highest Occupied Molecular Orbital/Conduction band) energy level of the current controlling layer 130 is higher than that of the first type semiconductor layer 122 for at least 0.2 eV, so as to block electrons transporting from the first type semiconductor layer 122 to the active layer 123. As a result, the electrons in the first type semiconductor layer 122 can only transport to the active layer 123 via the opening 131 of the current controlling layer 130. For example, the material of the current controlling layer 130 can be $Al_xGa_yN_{(1-x-y)}$ with superlattice structure.

Figure 3B:
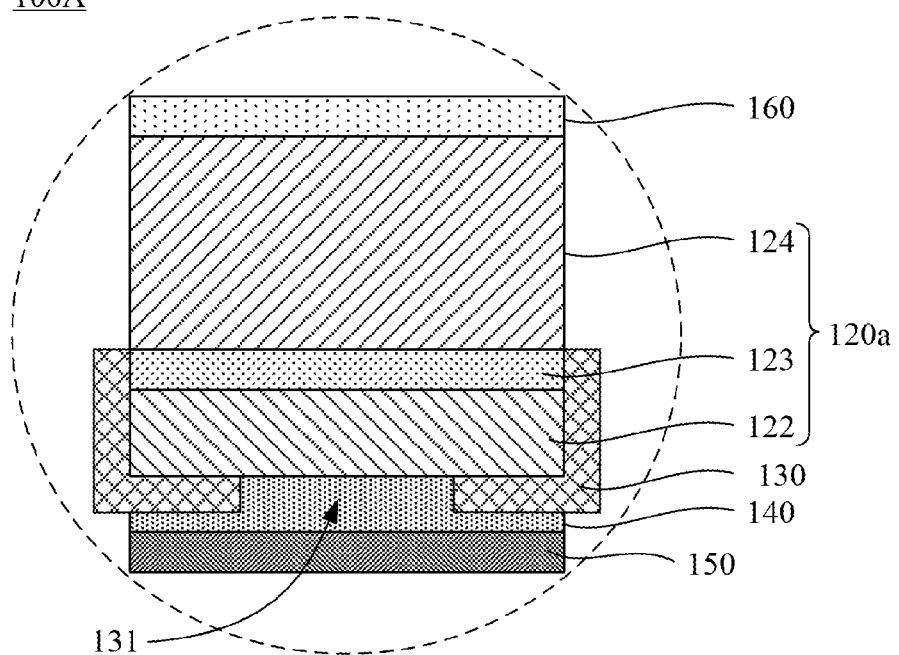
FIG. 3B is an enlarged cross-sectional view of the micro-LED according to an embodiment of this invention.

FIG. 3B is an enlarged cross-sectional view of the micro-LED 100A according to an embodiment of this invention. Similar to the current controlling layer 130 in FIG. 1B, the current controlling layer 130 of FIG. 3B partially cover a major surface of the first type semiconductor layer 122 distal to the second type semiconductor layer 124. The difference between the current controlling layer 130 of FIG. 3B and the current controlling layer 130 of FIG. 1B is that the current controlling layer 130 of FIG. 3B further at least partially covers the side surfaces of the first type semiconductor layer 122 and the active layer 123, and the current controlling layer 130 must be a dielectric layer. In this configuration, the side surfaces of the first type semiconductor layer 122 and the active layer 123 can be protected from moisture, process contamination, and mechanical damage by the current controlling layer 130. It is noted that all embodiments of the current controlling layer described above (i.e., the current controlling layers 130, 130a, and 122a) can be applied if the current controlling layer only partially covers the side surface of the first type semiconductor layer 122 without the side surface of the active layer 123.

Other details regarding the micro-LED 100A of FIG. 3B are similar to the micro-LED 100A of FIG. 1B and therefore are not repeated here to avoid duplicity.

Referring back to FIG. 1A, in the embodiment, the current controlling layer 130 is located at a side of the micro p-n diode 120a proximal to the bonding electrode 310 of the receiving substrate 300. That is, the opening 131 of the current controlling layer 130 faces toward the receiving substrate 300. The first type semiconductor layer 122 is electrically coupled with the first electrode 150 through the opening 131 of the current controlling layer 130. However, the invention is not limited in this regard.

Figure 4:
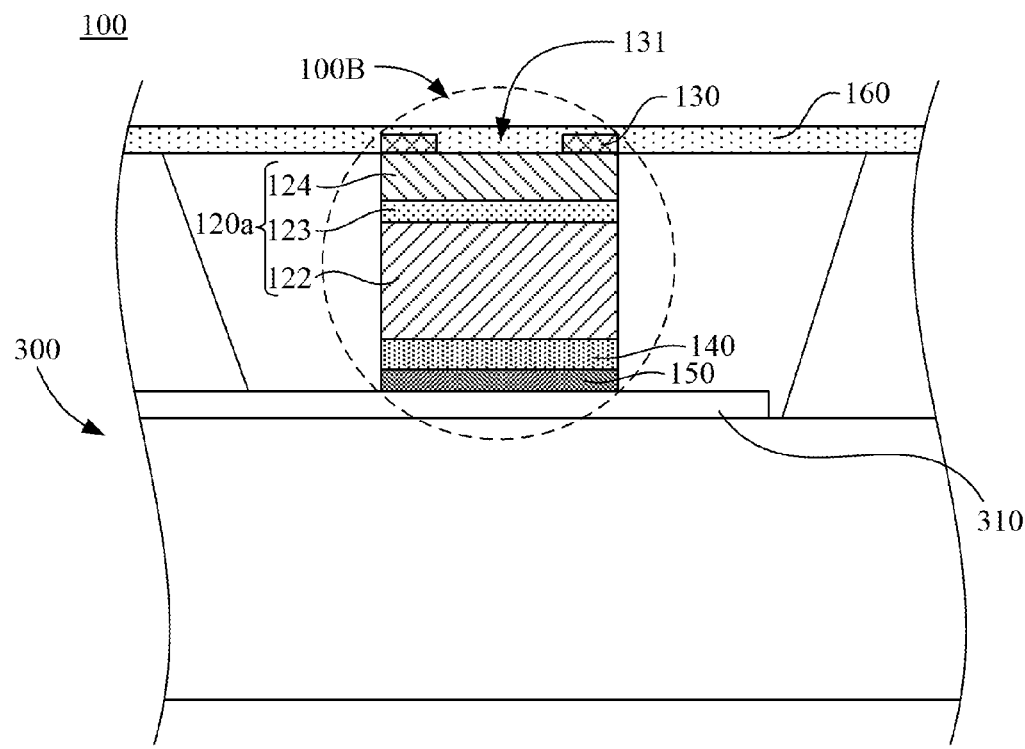
FIG. 4 is a cross-sectional view of a micro-LED device according to an embodiment of this invention.

FIG. 4 is a cross-sectional view of a micro-LED device 100 according to an embodiment of this invention. The micro-LED device 100 includes a receiving substrate 300 and a micro-LED 100B disposed on the receiving substrate 300. The micro-LED 100B also includes a micro p-n diode 120a, a current controlling layer 130, a reflective layer 140, a first electrode 150, and a second electrode 160. The difference between the micro-LED device of FIG. 4 and the micro-LED device 100 of FIG. 1A is that the current controlling layer 130 is located at a side of the micro p-n diodes 120a distal to the bonding electrode 310 of the receiving substrate 300. That is, the current controlling layer 130 is joined with the second type semiconductor layer 124, instead of being joined with the first type semiconductor layer 122. The second type semiconductor layer 124 is electrically coupled with the second electrode 160 through the opening 131 of the current controlling layer 130. The opening 131 of the current controlling layer 130 of FIG. 4 faces away from the receiving substrate 300.

In this embodiment, the first electrode 150 of the micro-LED 100B form an adhesive bonding system with the bonding electrode 310 of the receiving substrate 300, as illustrated previously. However, it should not limit the scope of the present invention. In some embodiment, the bonding electrode 310 of the receiving substrate 300 can be omitted, and the first electrode 150 of the micro-LED 100B can form the adhesive bonding system with the electrical wires of the receiving substrate 300.

As the embodiments of FIG. 1A, the feature of the first type semiconductor layer 122 and the second type semiconductor layer 124 can varies depending on the configuration of the current controlling layer 130, and the micro-LED 100B has a different operating method from that of the micro-LED 100A in FIG. 1A and FIG. 1B.

In this embodiment, the first type semiconductor layer 122 has a resistivity $\rho_1$ and a thickness $t_1$, the second type semiconductor layer 124 has a resistivity $\rho_2$ and a thickness $t_2$, and $$\sqrt{\frac{t_1}{\rho_1}} > \sqrt{\frac{t_2}{\rho_2}}.$$

The current controlling layer 130 is disposed on the second type semiconductor layer 122. The current controlling layer is a high resistivity layer which has a resistivity $\rho_h$, and $\rho_h > \rho_2$.

As the embodiments of FIG. 1A and FIG. 1B, herein, in some embodiments, the first type semiconductor layer 122 and the second type semiconductor layer 124 form a first p-n junction, the current controlling layer 130 and the second type semiconductor layer 124 form a second p-n junction, and the first electrode 150 and the second electrode 160 are configured to forward bias the first p-n junction while reverse bias the second p-n junction. In another embodiment, the current controlling layer 130 and the second type semiconductor layer 124 form a Schottky barrier.

In still another embodiment, the current controlling layer 130 can be a plasma-treated portion of the second type semiconductor layer 124. In still another embodiment, the current controlling layer 130 can be an electron blocking layer or a hole blocking layer, with the second type semiconductor layer 124 being an n type semiconductor layer or a p type semiconductor layer.

To manufacture the micro-LED 100B shown in FIG. 4, a semiconductor device layer 120 and a patterned current controlling layer 130 can be sequentially formed on a growth substrate 110 (as illustrated in FIG. 2C). A difference between the manufacturing of the micro-LED 100B of FIG. 4 and the micro-LED 100A of FIG. 1A is that the formation of the reflective layer 140 and the first electrode 150 of micro-LED 100B is performed after bonding the structure of FIG. 2C to the structure of FIG. 2F (as the operation illustrated in FIG. 2G) and removing the growth substrate 110. After forming the reflective layer 140 and the first electrode 150 on the thinned p-n diode layer 120, the combination of the reflective layer 140, the first electrode 150, the thinned p-n diode layer 120, and the current controlling layer 130 is etched to form a plurality of micro p-n diodes 120a (as the operation illustrated in FIG. 2I). Alternatively, in some embodiments, the reflective layer 140 and the first electrode 150 are formed on the receiving substrate 300 in advance, rather than formed on the thinned p-n diode layer 120.

Afterwards, to make the opening 131 of the current controlling layer 130 of FIG. 4 face away from the receiving substrate 300, the micro p-n diodes 120a can be transferred to another carrier substrate 200 to reverse the orientation of the micro p-n diodes 120a prior to transferring the micro p-n diodes 120a to the receiving substrate 300 (as the operation illustrated in FIG. 2I). After bonding the micro p-n diodes 120a to the later carrier substrate 200, the adhesion force of the adhesive layer 210 on the former carrier substrate 200 is decreased, so as to separate the micro p-n diodes 120a from the former carrier substrate 200. Alternatively, in some embodiments, the micro p-n diodes 120a can be picked up twice sequentially by two transfer heads to reverse the orientation of the micro p-n diodes 120a prior to transferring the micro p-n diodes 120a to the receiving substrate 300. Other details regarding the micro-LED 100B of FIG. 4 are similar to the micro-LED 100A of FIG. 1A and therefore are not repeated here to avoid duplicity.

Figure 5:
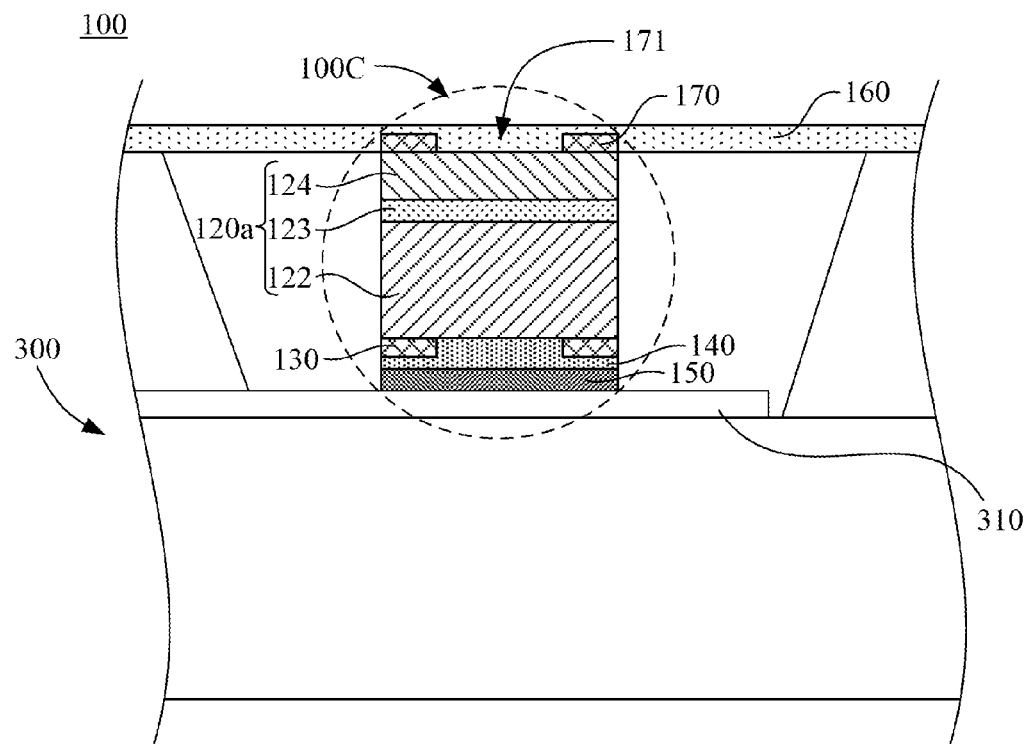
FIG. 5 is a cross-sectional view of a micro-LED device according to an embodiment of this invention.

FIG. 5 is a cross-sectional view of a micro-LED device 100 according to an embodiment of this invention. The micro-LED device 100 includes a receiving substrate 300 and a micro-LED 100C disposed on the receiving substrate 300. The micro-LED 100C also includes a micro p-n diode 120a, a current controlling layer 130, a reflective layer 140, a first electrode 150, and a second electrode 160, and further includes another current controlling layer 170. The micro p-n diode 120a includes the first type semiconductor layer 122, the active layer 123, and the second type semiconductor layer 124. The difference between the micro-LED 100C of FIG. 5 and the micro-LED 100A of FIG. 1A is that the micro-LED 100C further includes an additional current controlling layer 170 located at a side of the micro p-n diodes 120a distal to the bonding electrode 310 of the receiving substrate 300, in which the current controlling layer 170 has at least one opening 171 therein, and the second electrode 160 extends through the opening 171 of the current controlling layer 170 to be electrically coupled with the second type semiconductor layer 124. That is, the opening 171 of the current controlling layer 170 of FIG. 5 faces away from the receiving substrate 300.

To manufacture the micro-LED 100C shown in FIG. 5, operations illustrated by FIG. 2A-2H can be sequentially performed. A difference between the manufacturing of the micro-LED 100C of FIG. 5 and the micro-LED 100A of FIG. 1A is that the formation of the current controlling layer 170 is performed after removing the growth substrate 110. After forming the current controlling layer 170 on the thinned p-n diode layer 120, the combination of the current controlling layer 170, the thinned p-n diode layer 120, the current controlling layer 130, the reflective layer 140 and the first electrode 150 is etched to form a plurality of micro p-n diodes 120a (as the operation illustrated in FIG. 2H). Afterwards, the micro p-n diodes 120a are poised for pick up and transfer to the receiving substrate 300 (as the operation illustrated in FIG. 2I). Other details regarding the micro-LED 100C of FIG. 5 are similar to the micro-LED 100A of FIG. 1A and therefore are not repeated here to avoid duplicity.

Figure 6A:
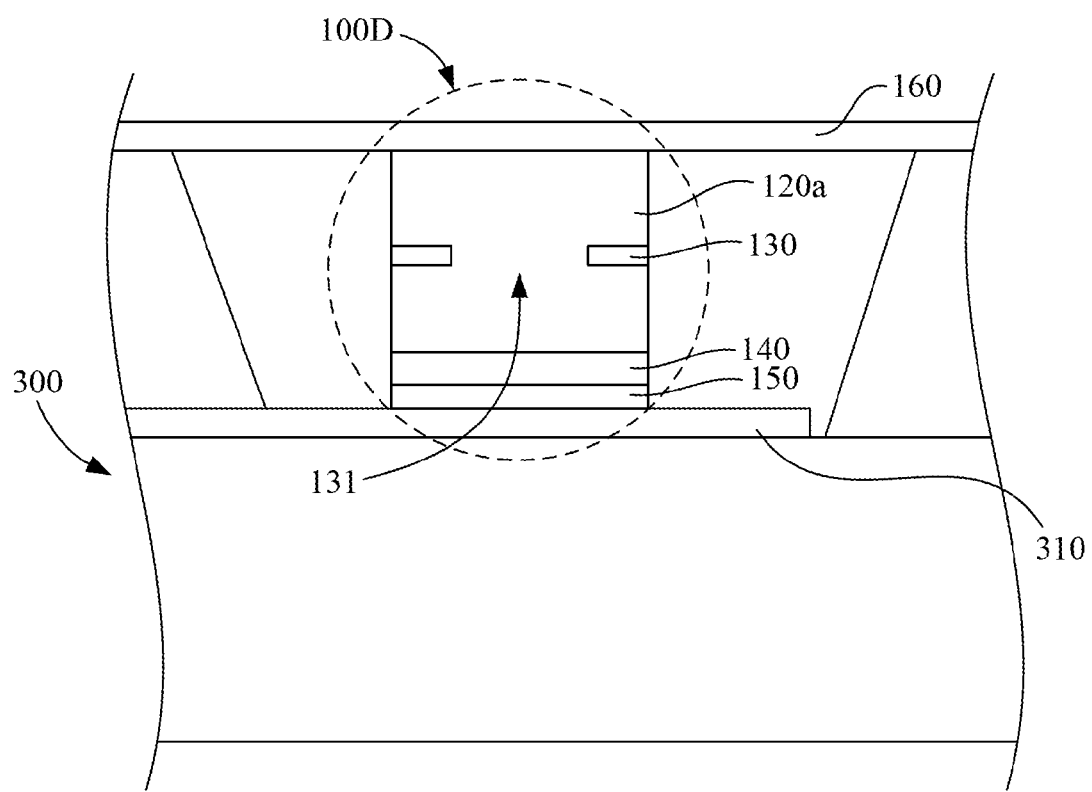
FIG. 6A is a cross-sectional view of a micro-LED device according to an embodiment of this invention.
Figure 6B:
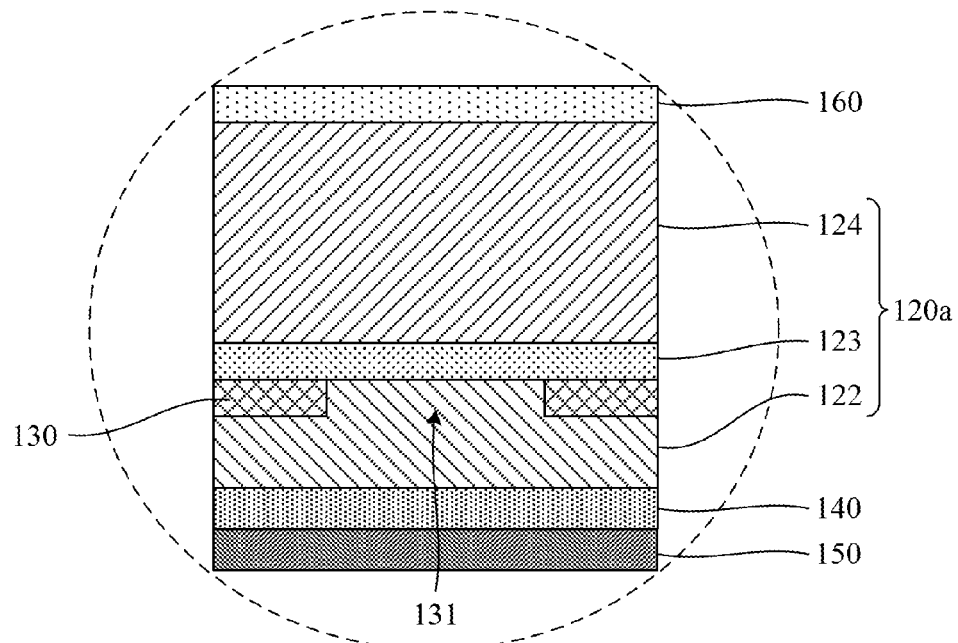
FIG. 6B is an enlarged cross-sectional view of the micro-LED in FIG. 6A according to an embodiment of this invention.

FIG. 6A is a cross-sectional view of a micro-LED device 100 according to an embodiment of this invention. The micro-LED device 100 includes a micro-LED 100D and a receiving substrate 300. FIG. 6B is an enlarged cross-sectional view of the micro-LED 100D in FIG. 6A according to an embodiment of this invention. The micro-LED 100D includes a micro p-n diode 120a, a current controlling layer 130 disposed in the micro p-n diode 120a, a reflective layer 140, a first electrode 150, and a second electrode 160. It is noted that the difference between the current controlling layer 130 of FIG. 6B and the current controlling layer 130 of FIG. 1A is that the current controlling layer 130 of FIG. 6B is disposed in the micro p-n diode 120a.

In some embodiments, to manufacture the micro-LED 100D in which the current controlling layer 130 is disposed in the micro p-n diode 120a, the formation of the current controlling layer 130 illustrated in FIGS. 2A & 2C can be brought forward to be performed after the formation of the active layer 123 and before the formation of the first type semiconductor layer 122 illustrated in FIG. 2B.

Alternatively, in some embodiments, to manufacture the micro-LED 100D in which the current controlling layer 130 is disposed in the micro p-n diode 120a, the formation of the current controlling layer 130 illustrated in FIGS. 2A & 2C can be brought forward to be performed during the formation of the first type semiconductor layer 122 illustrated in FIG. 2B.

Figure 6C:
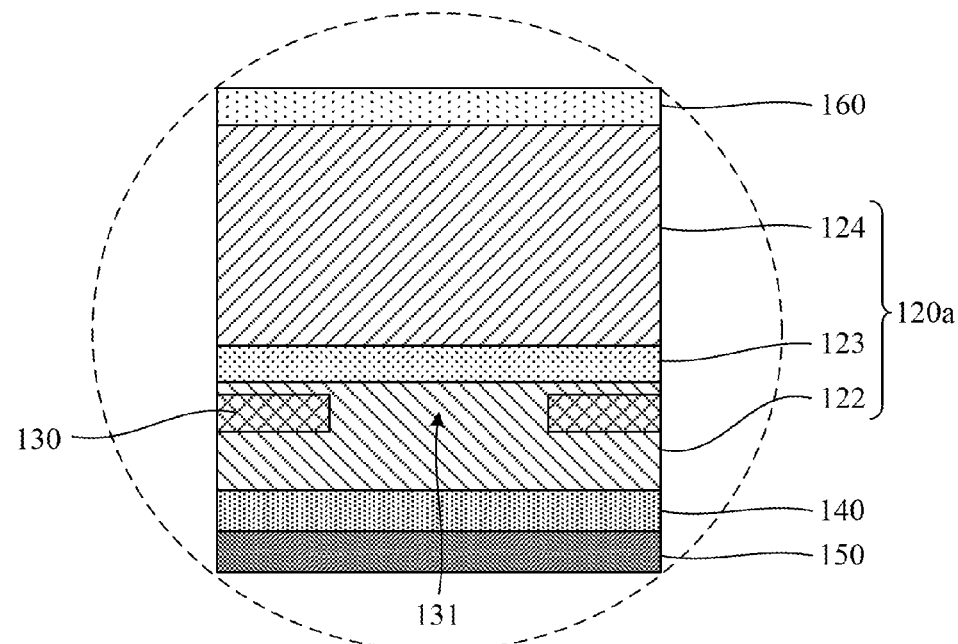
FIG. 6C is an enlarged cross-sectional view of the micro-LED in FIG. 6A according to an embodiment of this invention.

FIG. 6C is an enlarged cross-sectional view of the micro-LED 100D in FIG. 6A according to another embodiment of this invention. The difference between the current controlling layer 130 of FIG. 6C and the current controlling layer 130 of FIG. 6B is that the current controlling layer 130 of FIG. 6C is disposed in the first type semiconductor layer 122 without contacting the active layer 123. In this configuration, the first type semiconductor layer 122 may protect the active layer 123 while manufacturing the current controlling layer 130.

Figure 6D:
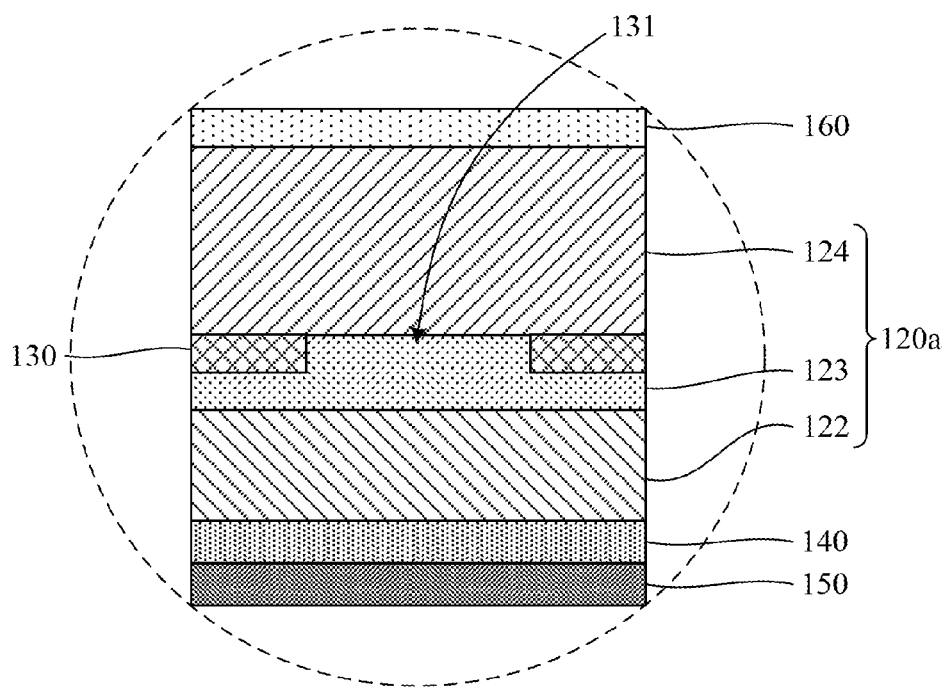
FIG. 6D is an enlarged cross-sectional view of the micro-LED in FIG. 6A according to an embodiment of this invention.

FIG. 6D is an enlarged cross-sectional view of the micro-LED 100D in FIG. 6A according to an embodiment of this invention. The differences between the current controlling layer 130 of FIG. 6D and the current controlling layer 130 of FIG. 1B are that the current controlling layer 130 of FIG. 6D is disposed between the second type semiconductor layer 124 and the active layer 123, the current controlling layer 130 contacts the active layer 123, the first type semiconductor layer 122 is a p type semiconductor layer, and the second type semiconductor layer 124 is an n type semiconductor layer. To manufacture the micro-LED 100D shown in FIG. 6D in which the current controlling layer 130 is disposed between the second type semiconductor layer 124 and the active layer 123, the formation of the current controlling layer 130 illustrated in FIGS. 2A & 2C can be brought forward to be performed before the formation of the active layer 123 illustrated in FIG. 2B. The opening 131 of the current controlling layer 130 can be filled with the active layer 123 or the second type semiconductor layer 124.

Other details regarding the micro-LED 100D of FIG. 6D are similar to the micro-LED 100D of FIG. 6B and therefore are not repeated here to avoid duplicity.

Figure 6E:
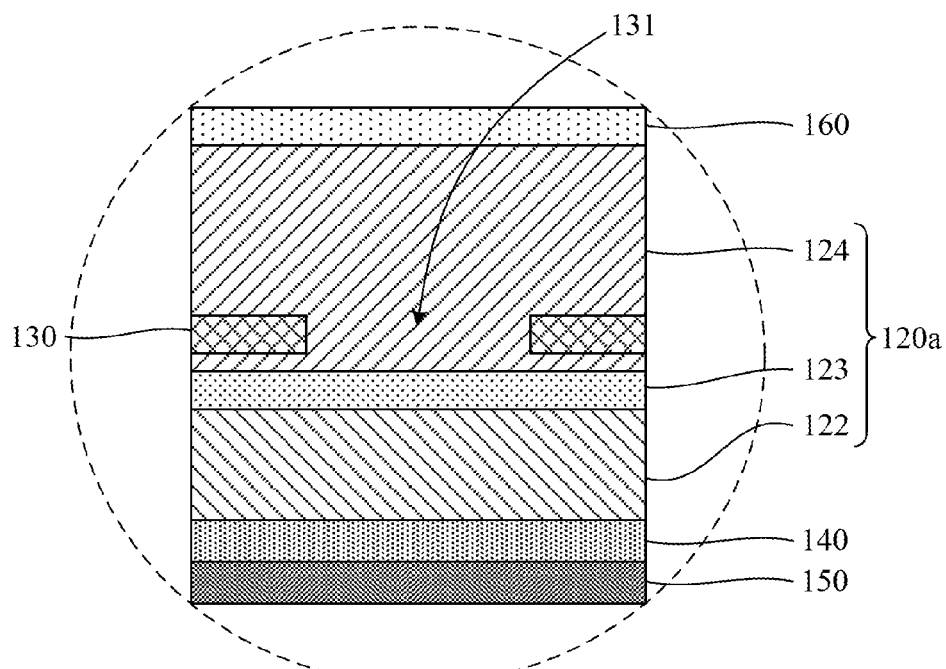
FIG. 6E is an enlarged cross-sectional view of the micro-LED in FIG. 6A according to an embodiment of this invention.

FIG. 6E is an enlarged cross-sectional view of the micro-LED 100D in FIG. 6A according to another embodiment of this invention. The difference between the current controlling layer 130 of FIG. 6E and the current controlling layer 130 of FIG. 6D is that the current controlling layer 130 of FIG. 6E is disposed in the second type semiconductor layer 124 without contacting the active layer 123.

To manufacture the micro-LED 100D shown in FIG. 6E in which the current controlling layer 130 is disposed in the second type semiconductor layer 124, the formation of the current controlling layer 130 illustrated in FIGS. 2A & 2C can be brought forward to be performed during the formation of the second type semiconductor layer 124 illustrated in FIG. 2B.

Other details regarding the micro-LED 100D of FIG. 6E are similar to the micro-LED 100D of FIG. 6D and therefore are not repeated here to avoid duplicity.

Figure 6F:
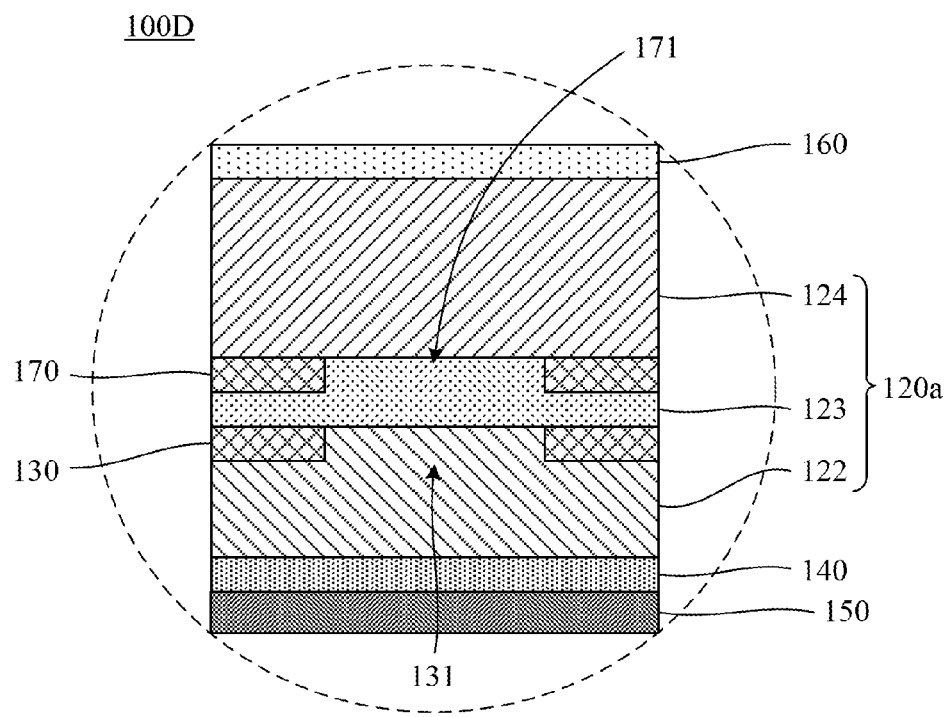
FIG. 6F is an enlarged cross-sectional view of the micro-LED in FIG. 6A according to an embodiment of this invention.

FIG. 6F is an enlarged cross-sectional view of the micro-LED 100D in FIG. 6A according to an embodiment of this invention. The difference between the micro-LED 100D of FIG. 6F and the micro-LED 100D of FIG. 6B is that the micro-LED 100D of FIG. 6F further includes a current controlling layer 170. The current controlling layer 170 is disposed between the active layer 123 and the second type semiconductor layer 124. That is, the current controlling layers 130 and 170 are respectively located at opposite sides of the active layer 123. To manufacture the micro-LED 100D shown in FIG. 6F in which the current controlling layer 130 is disposed between the first type semiconductor layer 122 and the active layer 123 and current controlling layer 170 is disposed between the second type semiconductor layer 124 and the active layer 123, the formation of the current controlling layer 170 can be performed after the formation of the second type semiconductor layer 124 and before the formation of the active layer 123 illustrated in FIG. 2B, and the formation of the current controlling layer 130 illustrated in FIGS. 2A & 2C can be brought forward to be performed after the formation of the active layer 123 and before the formation of the first type semiconductor layer 122 illustrated in FIG. 2B. Similarly, in some embodiments, the opening 171 of the current controlling layer 170 can be filled with the active layer 123 or the second type semiconductor layer 124.

Other details regarding the micro-LED 100D of FIG. 6F are similar to the micro-LED 100D of FIG. 6B and therefore are not repeated here to avoid duplicity.

Figure 6G:
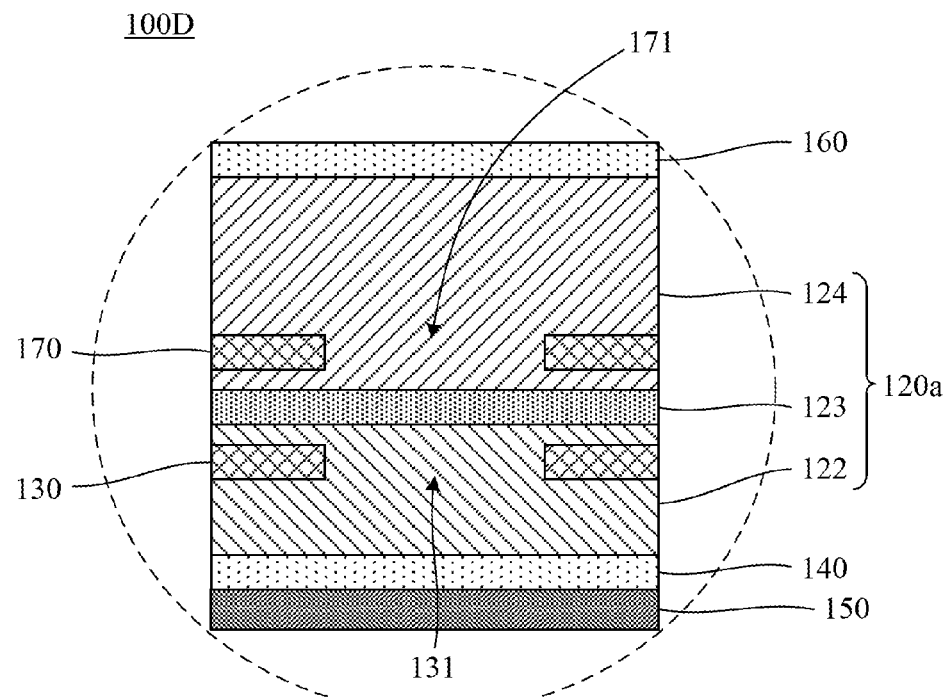
FIG. 6G is an enlarged cross-sectional view of the micro-LED in FIG. 6A according to an embodiment of this invention.

FIG. 6G is an enlarged cross-sectional view of the micro-LED 100D in FIG. 6A according to another embodiment of this invention. The differences between the current controlling layers 130 and 170 of FIG. 6G and the current controlling layers 130 and 170 of FIG. 6F are that the current controlling layer 130 of FIG. 6G is disposed in the first type semiconductor layer 122 without contacting the active layer 123 and the current controlling layer 170 of FIG. 6G is disposed in the second type semiconductor layer 124 without contacting the active layer 123. In this configuration, the first type semiconductor layer 122 may protect the active layer 123 while manufacturing the current controlling layer 130.

In some embodiments, only one of the current controlling layers 130 and 170 is formed to contact the active layer 123, and the other one of the current controlling layers 130 and 170 is formed without contacting the active layer 123.

To manufacture the micro-LED 100D shown in FIG. 6G in which the current controlling layer 130 is disposed in the first type semiconductor layer 122 and the current controlling layer 170 is disposed in the second type semiconductor layer 124, the formation of the current controlling layer 170 can be performed during the formation of the second type semiconductor layer 124 illustrated in FIG. 2B, and the formation of the current controlling layer 130 illustrated in FIGS. 2A & 2C can be brought forward to be performed during the formation of the first type semiconductor layer 122 illustrated in FIG. 2B. For example, the current controlling layer 170 can be formed after forming 90% of the second type semiconductor layer 124, and the rest 10% of the second type semiconductor layer 124 is then formed after the formation of the current controlling layer 170. For example, the current controlling layer 130 can be formed after forming 10% of the first type semiconductor layer 122, and the rest 90% of the first type semiconductor layer 122 is then formed after the formation of the current controlling layer 130.

Other details regarding the micro-LED 100D of FIG. 6G are similar to the micro-LED 100D of FIG. 6F and therefore are not repeated here to avoid duplicity.

In some embodiments, the current controlling layer 130 is disposed in the micro p-n diode 120a (e.g., between at least a part of the first type semiconductor layer 122 and the active layer 123 as shown in FIG. 6F and FIG. 6G), and the current controlling layer 170 is disposed outside the micro p-n diode 120a (e.g., between the second type semiconductor layer 124 and the second electrode 160 as shown in FIG. 4). In some embodiments, the current controlling layer 130 is disposed outside the micro p-n diode 120a (e.g., between the first type semiconductor layer 122 and the reflective layer 140 as shown in FIG. 1B), and the current controlling layer 170 is disposed in the micro p-n diode 120a (e.g., between at least a part of the second type semiconductor layer 124 and the active layer 123 as shown in FIG. 6F and FIG. 6G).

It is noted that in the micro-LEDs 100D of FIG. 6B to FIG. 6G, to achieve the purpose of current control, the current controlling layer 130 is a dielectric layer in some embodiments, but the invention is not limited in this regard. In some embodiments, the first type semiconductor layer 122 and the second type semiconductor layer 124 form a first p-n junction, the current controlling layer 130 and the first type semiconductor layer 122 form a second p-n junction, and the first electrode 150 and the second electrode 160 are configured to forward bias the first p-n junction while reverse bias the second p-n junction. In some embodiments, the first type semiconductor layer 122 and the second type semiconductor layer 124 form a p-n junction, and the current controlling layer 130 and the first type semiconductor layer 122 form a Schottky barrier. In some embodiments, the first type semiconductor layer 122 has the resistivity $\rho_1$, the current controlling layer 130 is a high resistivity layer which has a resistivity $\rho_h$, and $\rho_h > \rho_1$. In some embodiments, the first type semiconductor layer 122 is a p type semiconductor layer, the second type semiconductor layer 124 is an n type semiconductor layer, and the current controlling layer 130 is a hole blocking layer. In some embodiments, the first type semiconductor layer 122 is an n type semiconductor layer, the second type semiconductor layer 124 is a p type semiconductor layer, and the current controlling layer 130 is an electron blocking layer. The mechanism of controlling current of the current controlling layer 170 of FIG. 6F and FIG. 6G can be similar to one of the above embodiments of the current controlling layer 130 and therefore are not repeated here to avoid duplicity.

Figure 7:
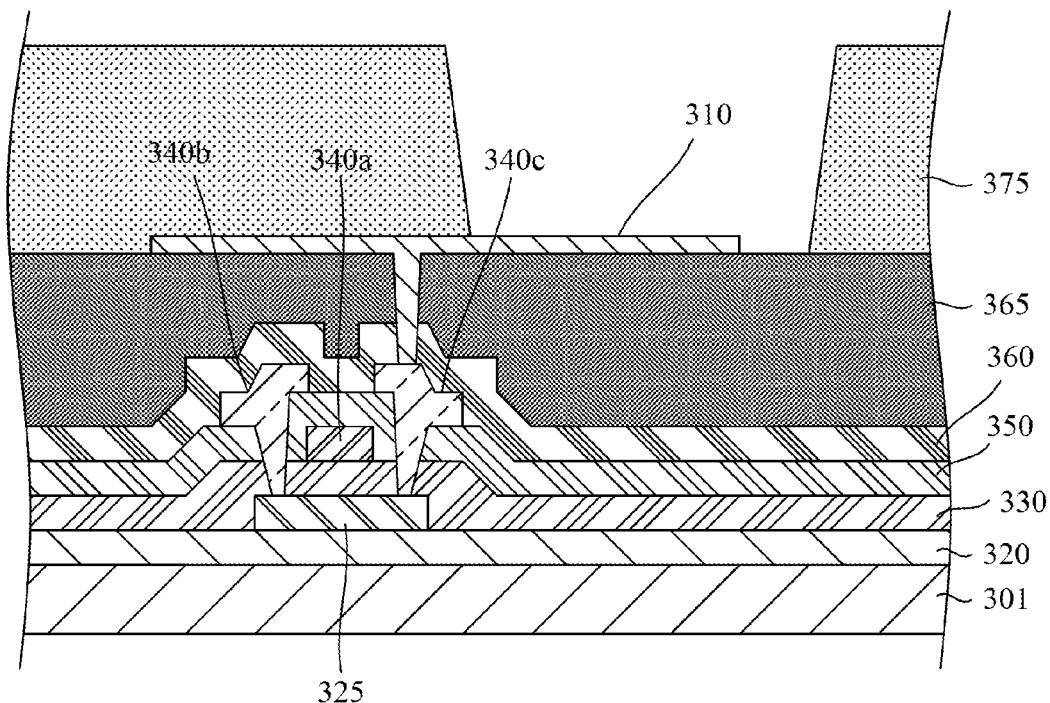
FIG. 7 is a cross-sectional views illustrating a receiving substrate according to an embodiment of the invention.

FIG. 7 is a cross-sectional view illustrating the receiving substrate 300 according to an embodiment of the invention. Referring to FIG. 7, a buffer layer 320 is formed on a substrate 301. A gate insulating layer 330 is formed on the entire surface of the substrate 301 having the semiconductor layer 325. A gate electrode 340a, an interlayer insulating layer 350, and source and drain electrodes 340b and 340c are formed on the gate insulating layer 330 to constitute a top gate structured thin film transistor (TFT). A passivation layer 360 and a planarization layer 365 are sequentially formed on or over an entire surface of the substrate 301, and a bonding electrode 310 is formed on the planarization layer 365 such that the bonding electrode 310 is electrically connected to the source or drain electrodes 340b and 340c by way of a via hole (not shown) formed through the passivation layer 360 and the planarization layer 365. A pixel defining layer 375 is then formed on or over the planarization layer 365 and/or a portion of the bonding electrode 310 to partially expose (or to expose a portion of) the bonding electrode 310.

Figure 8:
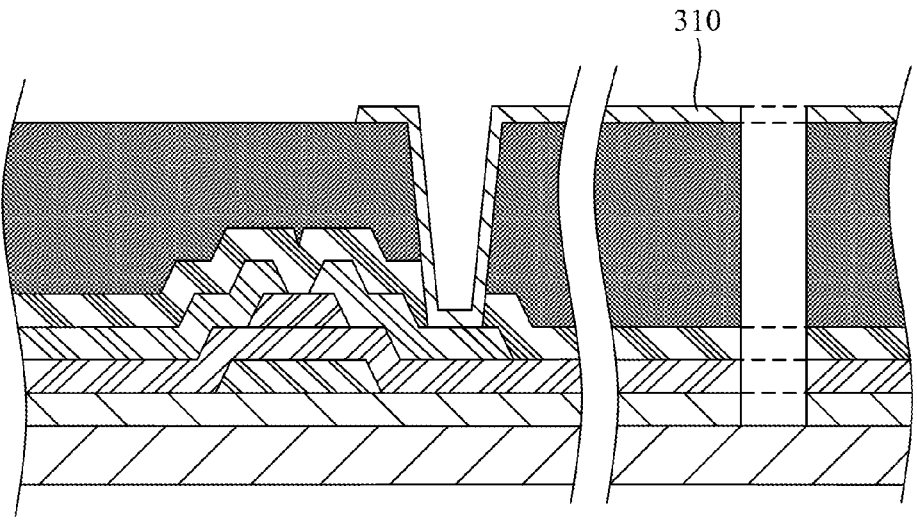
FIG. 8 is a cross-sectional view illustrating the receiving substrate according to another embodiment of the invention.

It is to be appreciated that the receiving substrate 300 with the top gate structured TFT illustrated in FIG. 7 is meant to be exemplary. FIG. 8 is a cross-sectional view illustrating the receiving substrate 300 according to another embodiment of the invention. Referring to FIG. 8, in the embodiment, the receiving substrate 300 is illustrated to include a bottom gate structured TFT, and the number of photomasks used to fabricate the receiving substrate 300 varies as needed. In some embodiments, a variety of suitable TFT of the receiving substrate 300 can be utilized in the invention.

Figure 9:
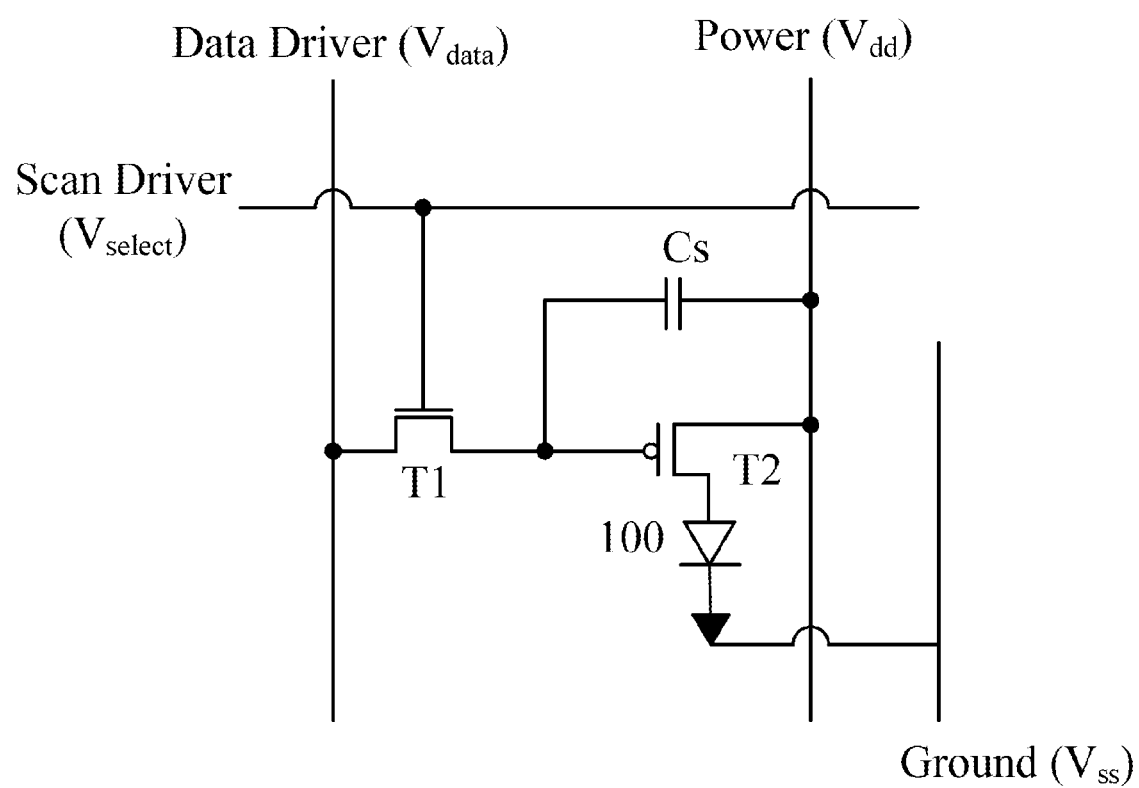
FIG. 9 is a circuit diagram of a subpixel with 2T1C circuitry in an active matrix display in accordance with an embodiment of the invention.

FIG. 9 is a circuit diagram of a subpixel with 2T1C circuitry according to an embodiment of the invention. In such an embodiment, the circuit can be used in the receiving substrate 300 illustrated in FIG. 7 or FIG. 8, which makes the receiving substrate 300 become an active matrix display substrate. The circuit includes a switching transistor T1, a driving transistor T2, a storage capacitor Cs, and a micro-LED 100. The transistors T1, T2 can be any type of transistor such as a thin film transistor. For example, the switching transistor T1 can be an n-type metal-oxide semiconductor (NMOS) transistor, and the driving transistor T2 can be a p-type metal-oxide semiconductor (PMOS) transistor. The switching transistor T1 has a gate electrode connected to a scan line $V_{select}$ and a first source/drain electrode connected to a data line $V_{data}$. The driving transistor T2 has a gate electrode connected to a second source/drain electrode of the switching transistor T1 and a first source/drain electrode connected to a power source $V_{dd}$. The storage capacitor Cs is connected between the gate electrode of the driving transistor T2 and the first source/drain electrode of the driving transistor T2. The micro-LED device 100 has an anode electrode connected to a second source/drain electrode of the driving transistor T2 and a cathode electrode connected to a ground $V_{ss}$.

In operation, a voltage level scan signal turns on the switching transistor T1, which enables the data signal to charge the storage capacitor Cs. The voltage potential that stores within the storage capacitor Cs determines the magnitude of the current flowing through the driving transistor T2, so that the micro-LED device 100 can emit light based on the current. It is to be appreciated that the 2T1C circuitry is meant to be exemplary, and that other types of circuitry or modifications of the traditional 2T1C circuitry are contemplated in accordance with embodiments of the invention. For example, more complicated circuits can be used to compensate for current distribution to the driver transistor and the micro device, or for their instabilities.

Figure 10:
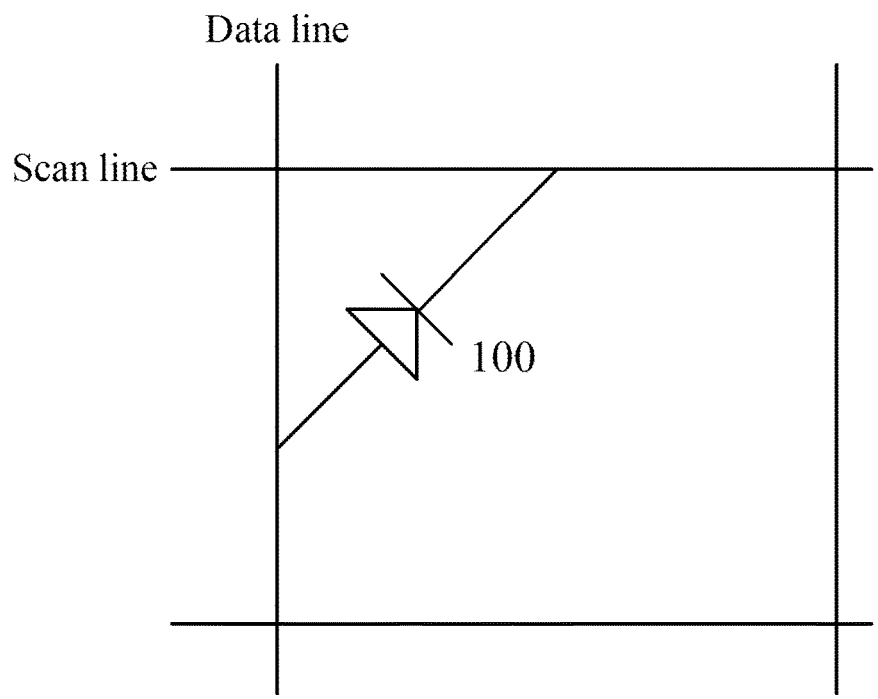
FIG. 10 is a circuit diagram of a subpixel according to an embodiment of the invention.

FIG. 10 is a circuit diagram of a sub-pixel according to an embodiment of the invention. In such an embodiment, the circuit used in the receiving substrate 300 makes the receiving substrate 300 become a passive matrix display substrate.

The embodiments of the present invention provide micro-light emitting diodes having two layers, which are a reflective layer and a bonding layer. The reflective layer has a melting point higher than a bonding temperature of an adhesive bonding system formed by the bonding layer. With appropriate conditions such as temperature and pressure, micro-light emitting diodes can be bonded on a substrate.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. § 112, 6th paragraph. In particular, the use of "step of" in the claims is not intended to invoke the provisions of 35 U.S.C. § 112, 6th paragraph.

What is claimed is:
1. A micro-light emitting diode device, comprising:
a receiving substrate; and a micro-LED comprising:
a first type semiconductor layer;
a second type semiconductor layer joined with the first type semiconductor layer;
a current controlling layer joined with the first type semiconductor layer, the current controlling layer having at least one opening therein;
at least one reflective layer electrically coupled with the first type semiconductor layer, wherein a portion of the reflective layer is present within said at least one opening of the current controlling layer and in surface-to-surface contact with an inner side surface of the current controlling layer, and a surface of the reflective layer away from the current controlling layer is substantially flat;
at least one first electrode disposed between the reflective layer and the receiving substrate, wherein the first electrode forms an adhesive bonding system with the receiving substrate;
a second electrode electrically connected with the second type semiconductor layer; and
an ohmic contact layer disposed between and joined with the second electrode and the second type semiconductor layer, wherein a vertical projection of said portion of the reflective layer on the receiving substrate is overlapped with a vertical projection of the ohmic contact layer on the receiving substrate.

2. The micro-LED device of claim 1, wherein a bonding temperature of the adhesive bonding system is lower than a melting point of the reflective layer.

3. The micro-LED device of claim 1, wherein the receiving substrate comprises a bonding electrode, and the bonding electrode and the first electrode form the adhesive bonding system.

4. The micro-LED device of claim 3, wherein the adhesive bonding system is a eutectic system, a soldering contact, a transient liquid phase sintering system, or a conductive adhesive bonding system formed by the bonding electrode and the first electrode, and a bonding temperature of the adhesive bonding system is a eutectic point of the eutectic system, a soldering point of the soldering contact, a sintering point of the transient liquid phase sintering system, or a conductive adhesive bonding temperature of the conductive adhesive bonding system.

5. The micro-LED device of claim 3, wherein the first type semiconductor layer is electrically coupled with the first electrode through the opening of the current controlling layer, and a contact area between the first electrode and the bonding electrode is greater than a size of the opening.

6. The micro-LED device of claim 3, wherein the bonding electrode is a metal layer, a transparent conductive layer, or a conductive adhesive layer.

7. The micro-LED device of claim 1, wherein the first electrode is a metal layer or a conductive adhesive layer.

8. The micro-LED device of claim 1, wherein a plurality of the reflective layers are stacked together.

9. The micro-LED device of claim 1, wherein a plurality of the first electrodes are stacked together.

10. The micro-LED device of claim 1, wherein the current controlling layer is a dielectric layer.

11. The micro-LED device of claim 1, wherein said one of the first type semiconductor layer and the second type semiconductor layer has a resistivity $\rho_s$ and a thickness $t_s$, the other of the first type semiconductor layer and the second type semiconductor layer has a resistivity $\rho_o$ and a thickness $t_o$, and $$\sqrt{\frac{t_s}{\rho_s}} < \sqrt{\frac{t_o}{\rho_o}}.$$

12. The micro-LED device of claim 1, wherein the reflective layer is made of metal.

13. The micro-LED device of claim 1, wherein the micro-LED comprises:
an active layer disposed between the first type semiconductor layer and the second type semiconductor layer.

14. The micro-LED device of claim 13, further comprising:
an additional current controlling layer disposed in the second type semiconductor layer and in contact with the active layer, and the additional current controlling layer having at least one opening therein.

15. The micro-LED device of claim 13, further comprising:
an additional current controlling layer disposed in the second type semiconductor layer without contacting the active layer, and the additional current controlling layer having at least one opening therein.

16. The micro-LED device of claim 1, wherein the micro-LED comprises:
an additional current controlling layer joined with the second type semiconductor layer and having at least one opening therein.

17. The micro-LED device of claim 1, wherein the micro-LED comprises an additional ohmic contact layer disposed between the first type semiconductor layer and the reflective layer.

* * * * *